(12) United States Patent
Fujikawa et al.

(10) Patent No.: US 10,640,138 B2
(45) Date of Patent: May 5, 2020

(54) STEERING WHEEL GRIP DETECTION DEVICE

(71) Applicant: Panasonic Intellectual Property Management Co., Ltd., Osaka (JP)

(72) Inventors: Shinji Fujikawa, Hiroshima (JP); Yuta Okazaki, Osaka (JP); Hiroshi Naitou, Osaka (JP); Tsuyoshi Nishio, Chiba (JP); Nobuharu Katsuki, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 283 days.

(21) Appl. No.: 15/548,998

(22) PCT Filed: Feb. 25, 2016

(86) PCT No.: PCT/JP2016/000997
§ 371 (c)(1),
(2) Date: Aug. 4, 2017

(87) PCT Pub. No.: WO2016/147575
PCT Pub. Date: Sep. 22, 2016

(65) Prior Publication Data
US 2018/0022374 A1    Jan. 25, 2018

(30) Foreign Application Priority Data

Mar. 13, 2015    (JP) .................................. 2015-050838

(51) Int. Cl.
*B62D 1/06*    (2006.01)
*B62D 1/04*    (2006.01)
(Continued)

(52) U.S. Cl.
CPC ............ *B62D 1/065* (2013.01); *B60R 16/037* (2013.01); *B62D 1/046* (2013.01); *H03K 17/962* (2013.01); *G01V 3/08* (2013.01)

(58) Field of Classification Search
CPC .......... B62D 1/065; B62D 1/04; B62D 1/046; H03K 17/962; H03K 17/9604; H03K 17/9313; B60R 16/037; G01V 3/08
See application file for complete search history.

(56) References Cited

U.S. PATENT DOCUMENTS

2002/0170900 A1    11/2002 Braeuchle et al.
2013/0098890 A1*   4/2013  Virnich ................ B60N 2/5685
                                                      219/204

FOREIGN PATENT DOCUMENTS

DE          69502091 T2    10/1998
JP          2002-340712    11/2002
(Continued)

OTHER PUBLICATIONS

International Search Report of PCT application No. PCT/JP2016/000997 dated May 17, 2016.
(Continued)

*Primary Examiner* — Shawntina T Fuqua
(74) *Attorney, Agent, or Firm* — Greenblum & Bernstein, P.L.C.

(57) ABSTRACT

A steering wheel grip detection device includes a series circuit including an inductance element, a thermostat incorporated into a steering wheel, and a heater incorporated into the steering wheel; an electrostatic sensor circuit that detects a grip of the steering wheel by means of an electric or electromagnetic field; and a voltage detecting circuit that detects an open/closed state of the thermostat.

15 Claims, 24 Drawing Sheets

(51) Int. Cl.
    *B60R 16/037*    (2006.01)
    *H03K 17/96*    (2006.01)
    *G01V 3/08*     (2006.01)

(56) References Cited

FOREIGN PATENT DOCUMENTS

| | | |
|---|---|---|
| JP | 2010-023649 | 2/2010 |
| JP | 2010-215140 | 9/2010 |
| JP | 2014-190856 | 10/2014 |

OTHER PUBLICATIONS

German Office Action from the German Patent and Trademark Office dated Dec. 12, 2019 for the related German Patent Application No. 112016001183.0, together with an English language translation.

* cited by examiner

STEERING WHEEL GRIP DETECTION DEVICE

This application is a U.S. national stage application of the PCT International Application No. PCT/JP2016/000997 filed on Feb. 25, 2016, which claims the benefit of foreign priority of Japanese patent application No. 2015-050838 filed on Mar. 13, 2015, the contents all of which are incorporated herein by reference.

TECHNICAL FIELD

The present disclosure relates to a steering wheel grip detection device, particularly to one that reduces the influence of an open/closed state of a thermostat for a heater in the steering wheel that detects a grip with hands from change in the electrostatic capacitance of the heater.

BACKGROUND ART

There has been devised a device for detecting contact between hands and a steering wheel as described in PTL 1 for example. A block circuit diagram of the detecting device is shown in FIG. 25.

In FIG. 25, first oscillator 103 including first capacitor 101 generates a first signal with frequency f1. First capacitor 101 is provided in a steering wheel (unillustrated) of a vehicle (unillustrated). First capacitor 101 may be part of an existing heater, for example, of the steering wheel. Such a heater typically adjusts temperature and prevents overheating using a thermostat.

Second oscillator 109 including second capacitor 105 and adjustable third capacitor 107 generates a second signal with second frequency f2. When the hands of a driver are not present on the steering wheel, first frequency f1 and second frequency f2 are equal to each other. Mixer 111 forms an absolute value of the difference between the two frequencies. The absolute value is converted to output voltage U by frequency-voltage converter 113.

If a driver's hands approach the steering wheel and finally grip it, this influences first capacitor 101 to change first frequency f1. Then, as the hands approach the steering wheel, voltage U continuously rises. When voltage U exceeds first threshold S1, contact between the hands and the steering wheel is immediately detected.

CITATION LIST

Patent Literature

PTL 1: Japanese Patent Unexamined Publication No. 2002-340712

SUMMARY

An object of the present disclosure, in order to solve existing problems, is to provide a steering wheel grip detection device that detects an open/closed state of a thermostat to reduce the influence on detection of a hand grip.

A steering wheel grip detection device of the present disclosure includes a series circuit including an inductance element, a thermostat, and a heater; and an electrostatic sensor circuit. The series circuit is electrically connected to between the positive and negative electrodes of the power supply. The thermostat and the heater are incorporated into the steering wheel. The electrostatic sensor circuit is electrically connected to the end of the heater to which the inductance element is electrically connected, or to the middle of the wiring path of the heater, to detect a grip of the steering wheel by means of an electric or electromagnetic field. The steering wheel grip detection device is further provided with a voltage detecting circuit electrically connected to (1) between any one of the connecting points between the inductance element, the thermostat, and the heater, and the wiring path of the positive electrode; (2) between any one of the connecting points between the inductance element, the thermostat, and the heater, and the wiring path of the negative electrode; (3) the two ends of the inductance element; (4) the two ends of the heater; or (5) the two ends of the thermostat.

The steering wheel grip detection device of the present disclosure includes a series circuit including an inductance element, a thermostat, and a heater; and an electrostatic sensor circuit. The series circuit is electrically connected to between the positive and negative electrodes of the power supply. The thermostat and the heater are incorporated into the steering wheel. The electrostatic sensor circuit is electrically connected to the end of the heater to which the inductance element is electrically connected, or to the middle of the wiring path of the heater, to detect a grip of the steering wheel by means of an electric or electromagnetic field. The steering wheel grip detection device is further provided with a current detecting circuit electrically series-connected to the wiring path of the series circuit.

A steering wheel grip detection device of the present disclosure detects an open/closed state of a thermostat from output of the voltage detecting circuit or output of the current detecting circuit. Hence, the detection device presents an advantage that reduces the influence of the thermostat on detecting hand contact.

DESCRIPTION OF EMBODIMENTS

Prior to the description of embodiments of the present disclosure, a simplified description is made of problems in existing devices. By the above-described device that detects contact between hands and a steering wheel, a driver's hands gripping a steering wheel allows the device to detect contact between the hands and the steering wheel. Here, to detect contact between hands and a steering wheel, the heater of the steering wheel is used, and its change of the capacitance, namely change of the capacitance of first capacitor 101, is detected as change of the frequency. In this case, an open/close operation of a thermostat for temperature adjustment and overheating prevention causes the heater to repeat conducting a current or not in response to the operation. This influences the capacitance of first capacitor 101, which undesirably causes an error in detecting contact with hands.

Hereinafter, a description is made of some embodiments of the present disclosure with reference to the related drawings.

First Exemplary Embodiment

Figure 1:
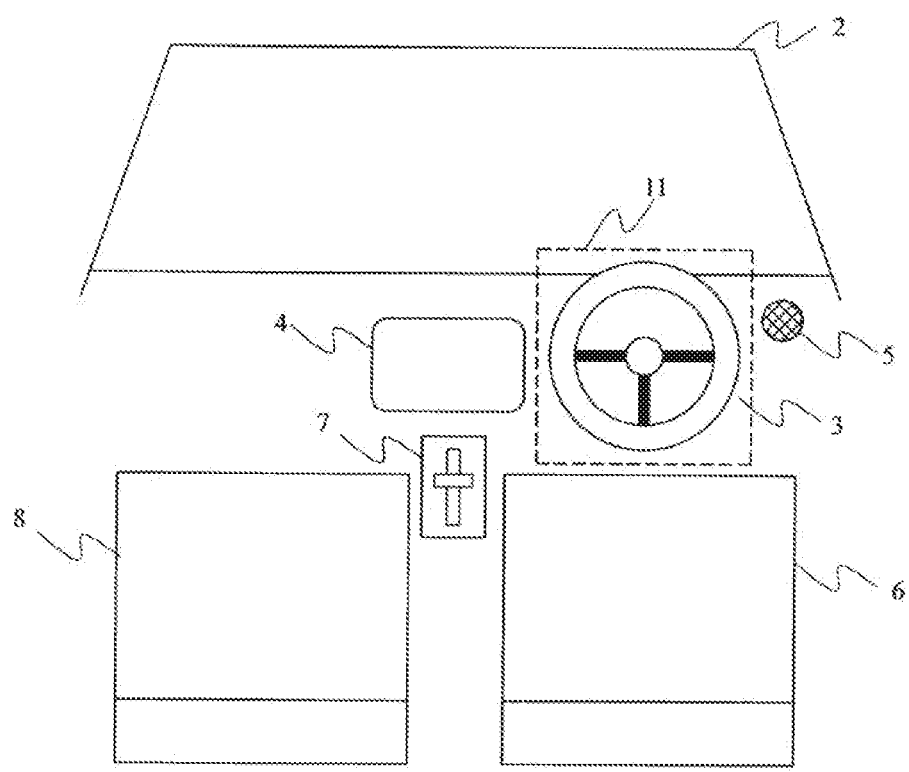
FIG. 1 A schematic diagram of the inside of a cabin including a steering wheel grip detection device according to the first exemplary embodiment of the present disclosure.
Figure 2:
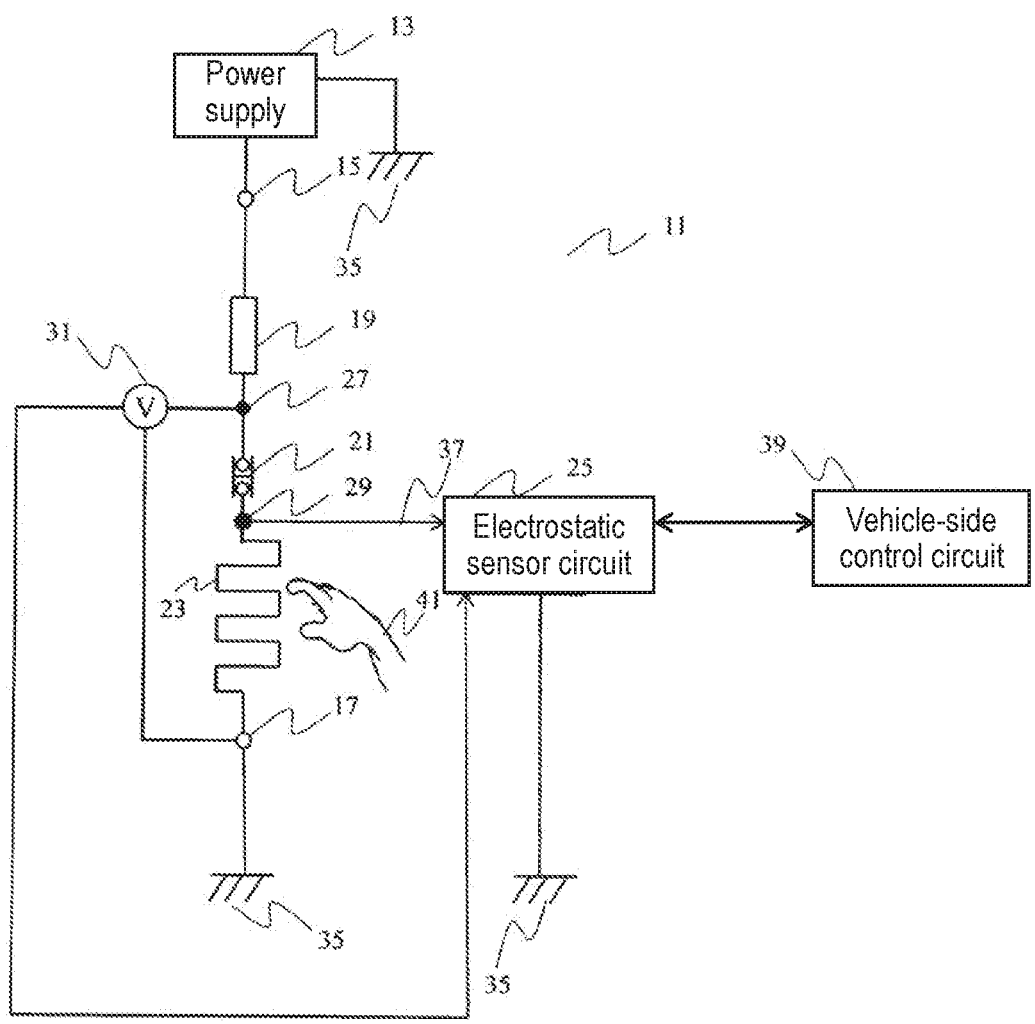
FIG. 2 A block circuit diagram of the steering wheel grip detection device according to the first embodiment.
Figure 3:
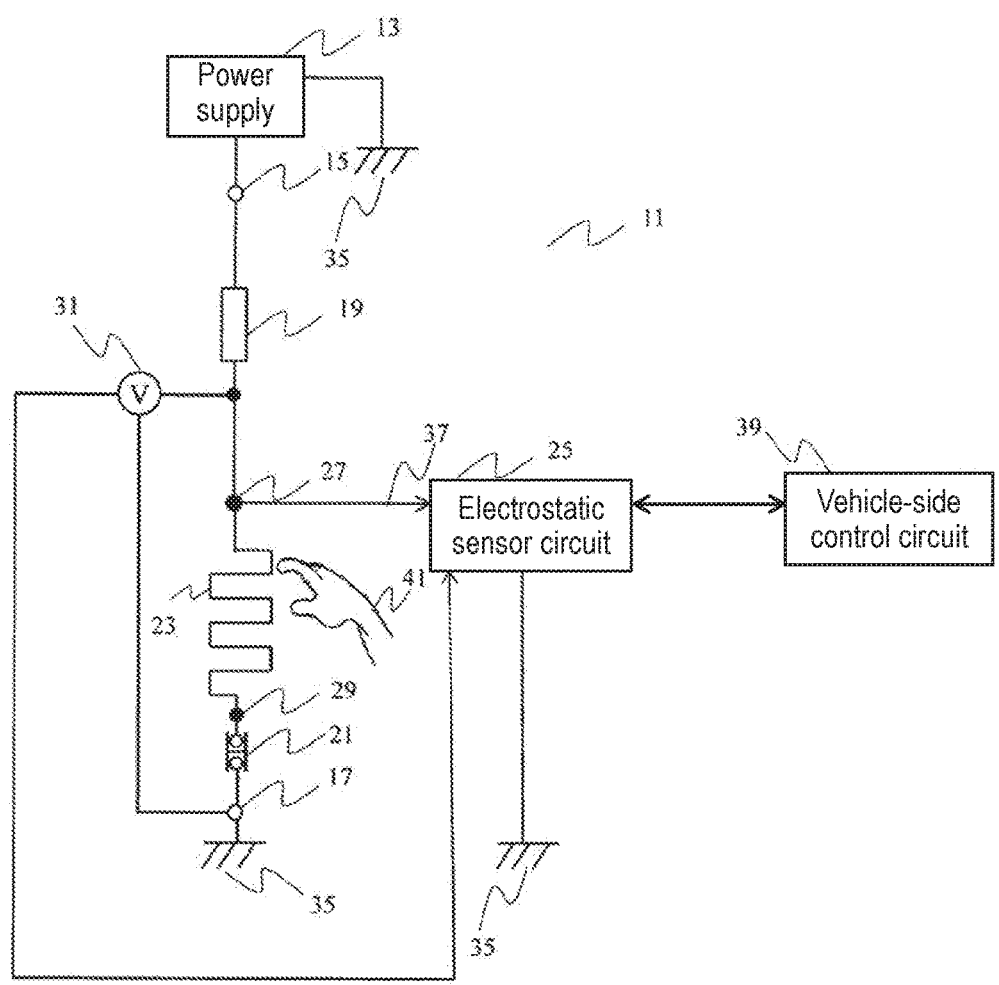
FIG. 3 Another block circuit diagram of the steering wheel grip detection device according to the first embodiment.
Figure 4:
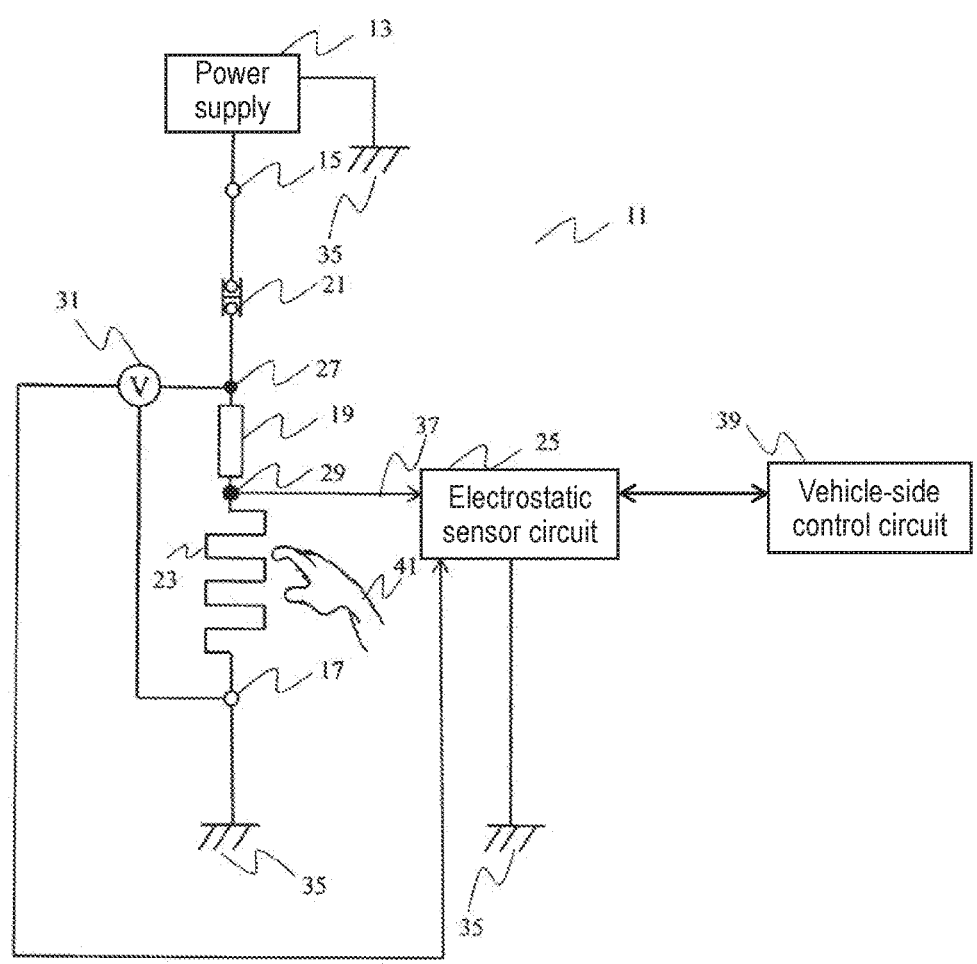
FIG. 4 Another block circuit diagram of the steering wheel grip detection device according to the first embodiment.
Figure 5:
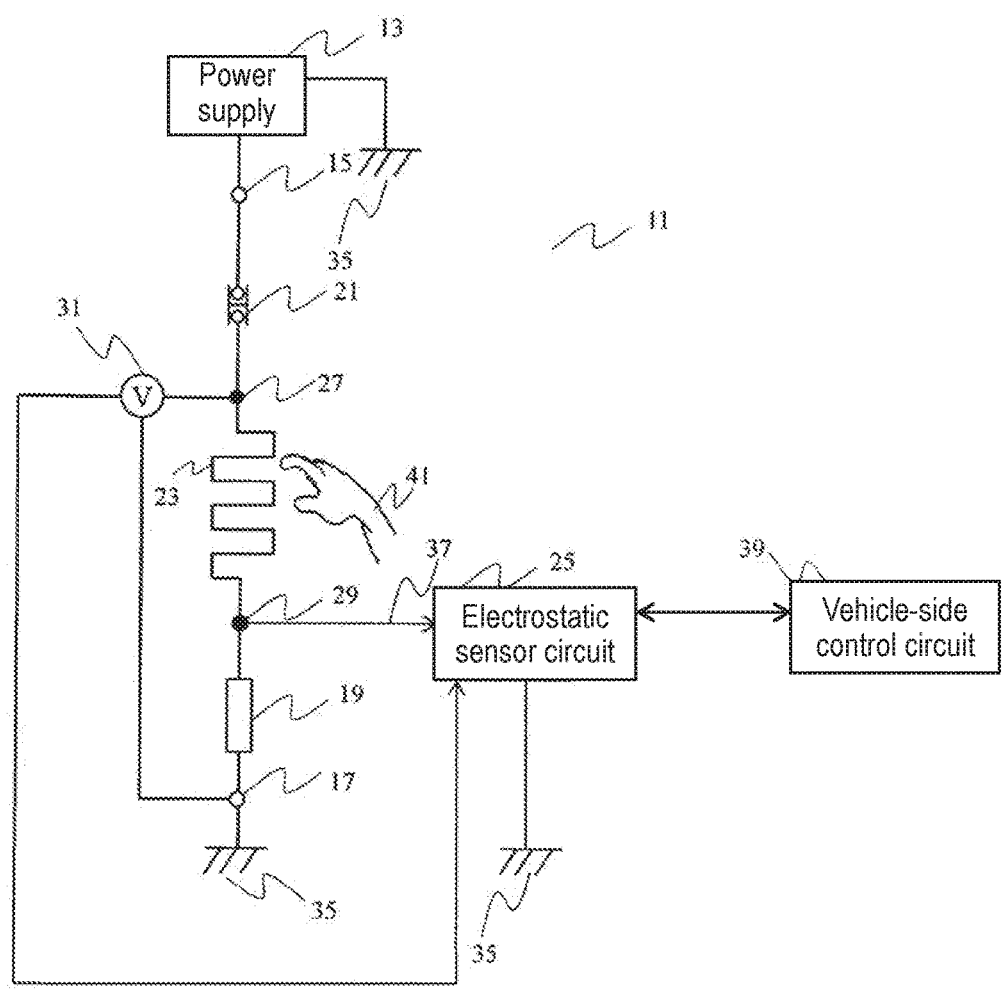
FIG. 5 Another block circuit diagram of the steering wheel grip detection device according to the first embodiment.
Figure 6:
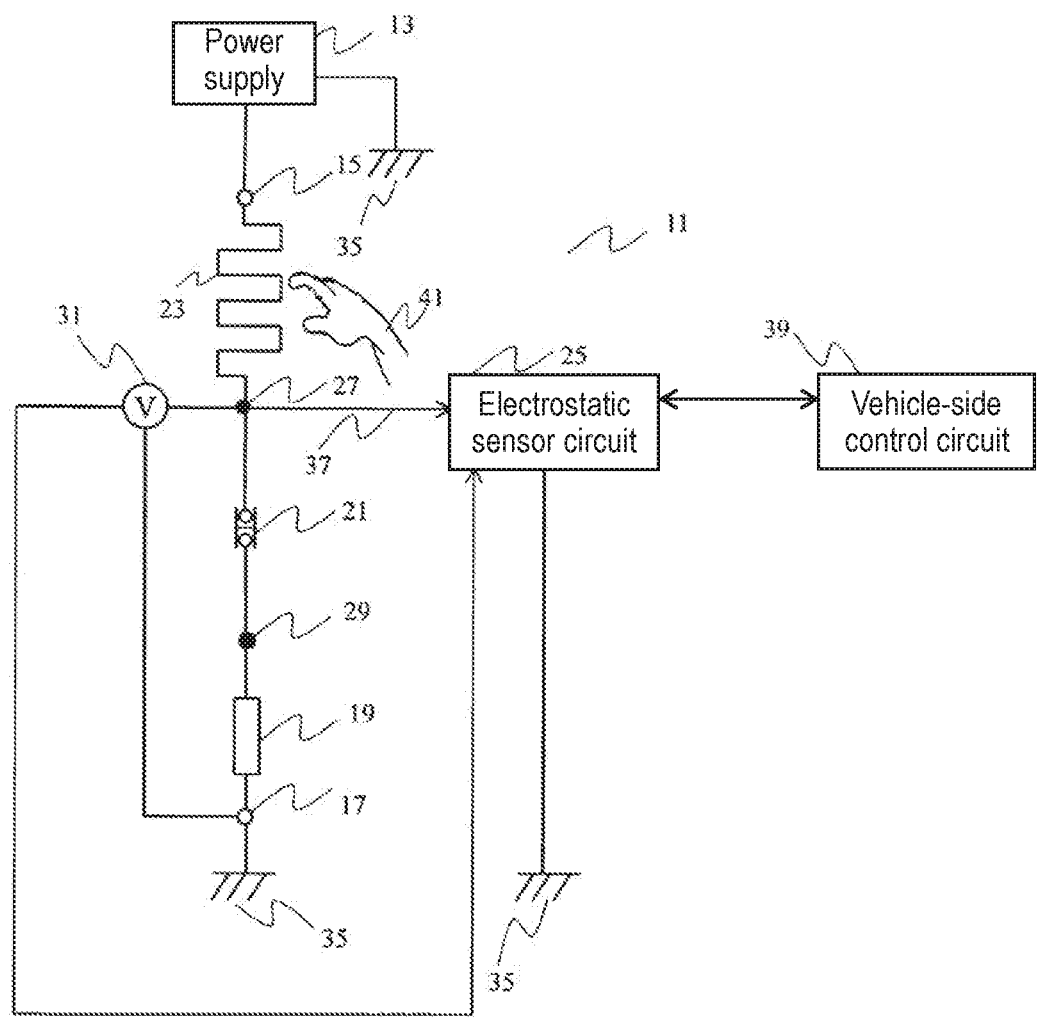
FIG. 6 Another block circuit diagram of the steering wheel grip detection device according to the first embodiment.
Figure 7:
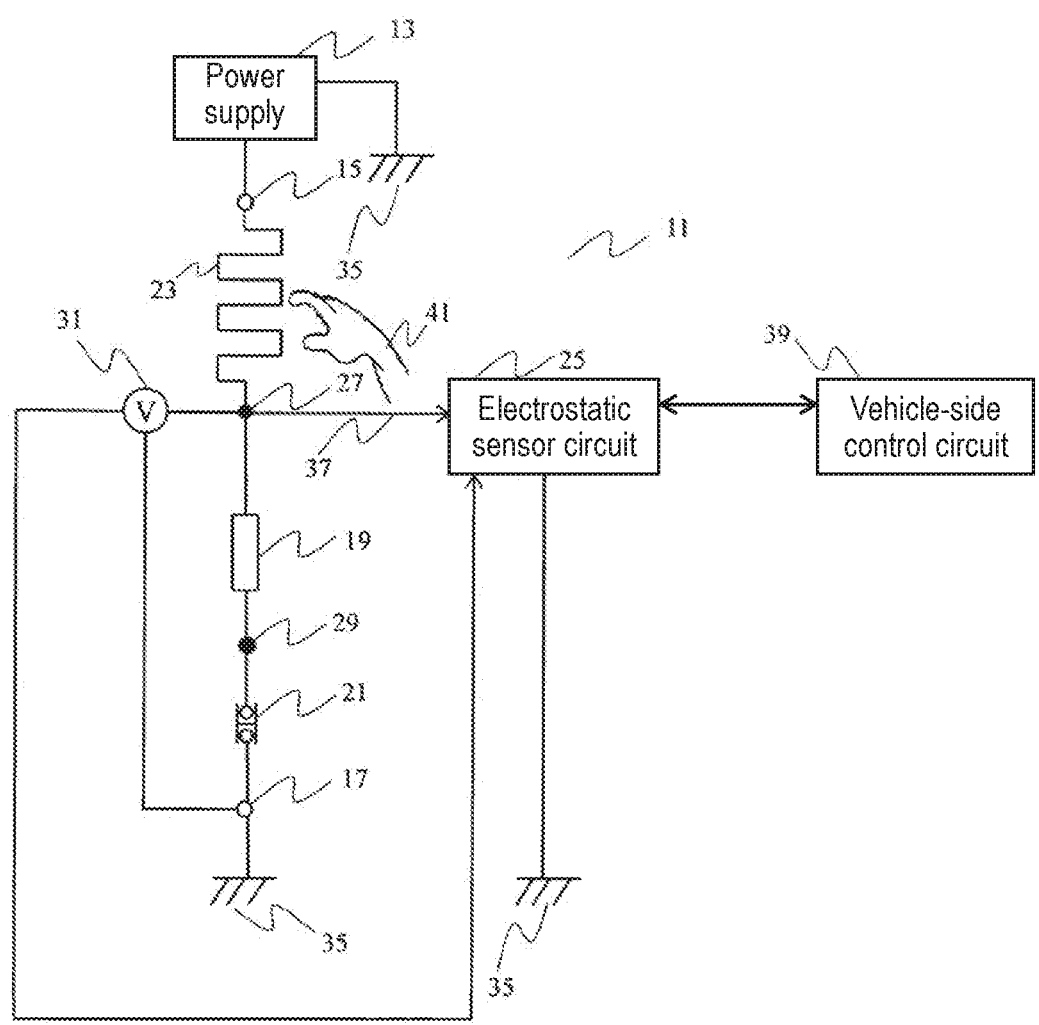
FIG. 7 Another block circuit diagram of the steering wheel grip detection device according to the first embodiment.
Figure 8:
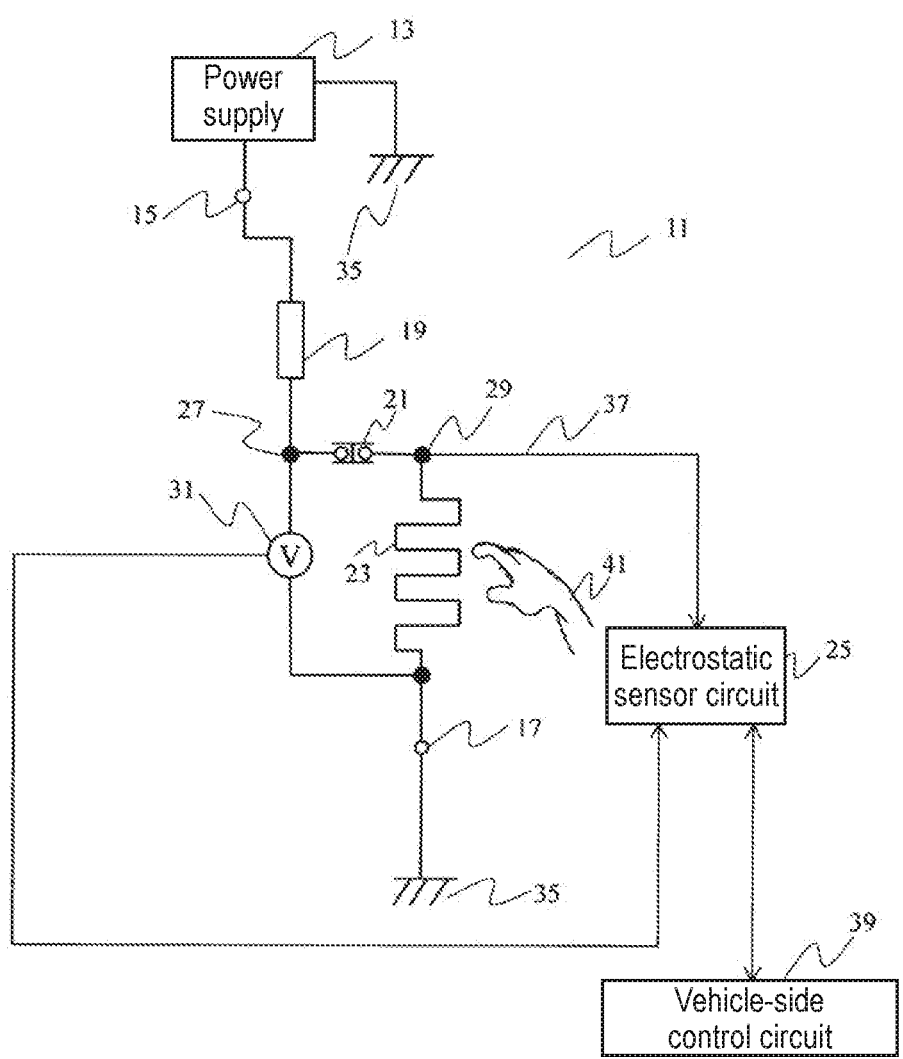
FIG. 8 Another block circuit diagram of the steering wheel grip detection device according to the first embodiment.
Figure 9:
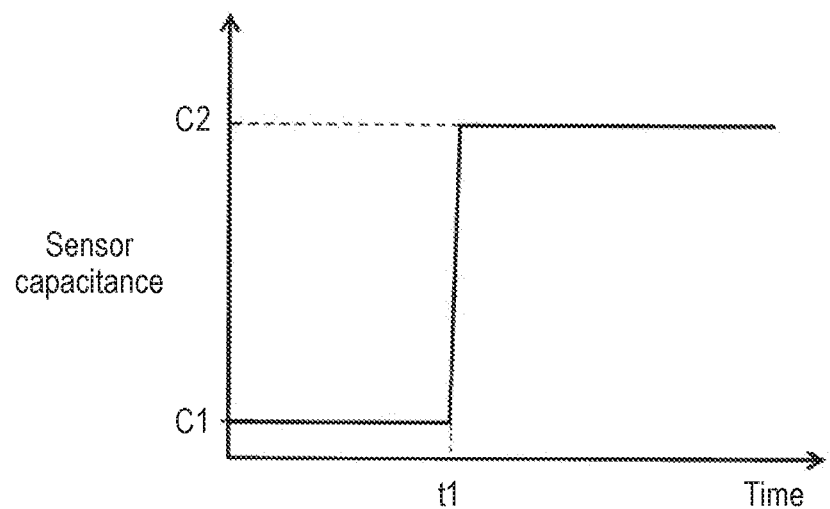
FIG. 9 A temporal characteristic diagram of the sensor capacitance of the steering wheel grip detection device according to the first embodiment.
Figure 10:
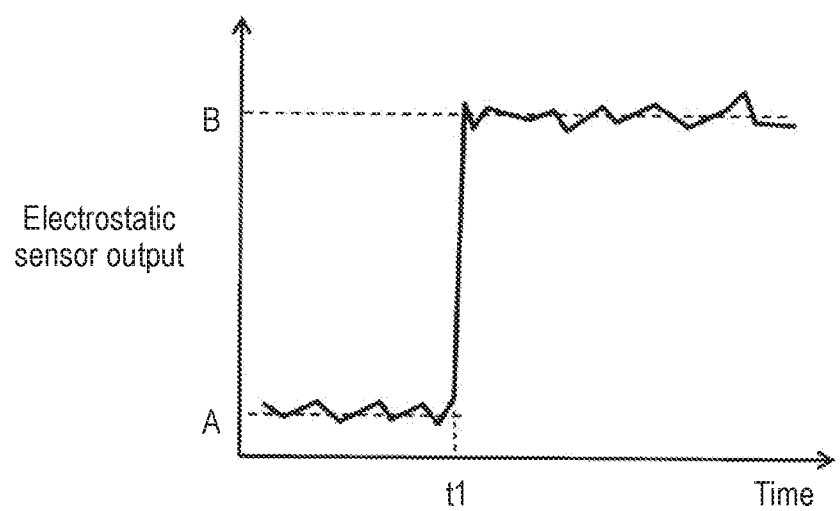
FIG. 10 A temporal characteristic diagram of electrostatic sensor output of the steering wheel grip detection device according to the first embodiment.
Figure 11:
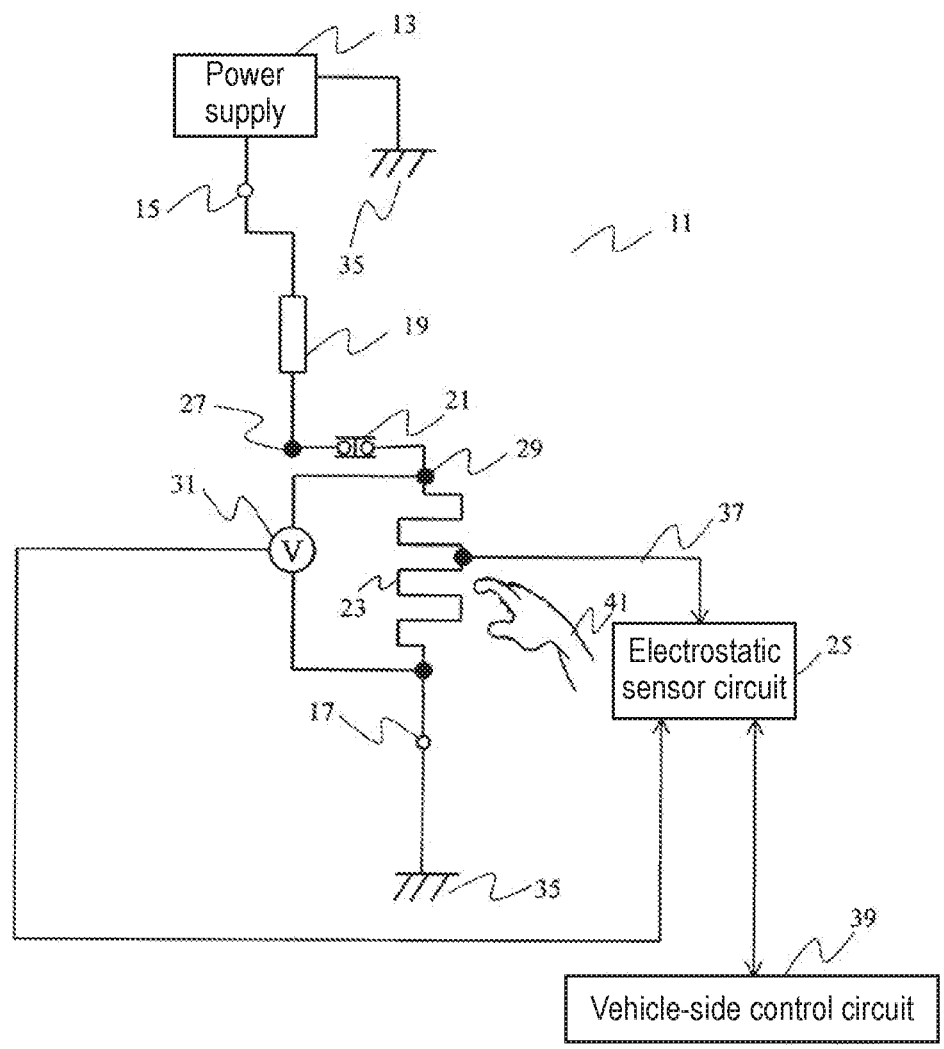
FIG. 11 Another block circuit diagram of the steering wheel grip detection device according to the first embodiment.
Figure 12:
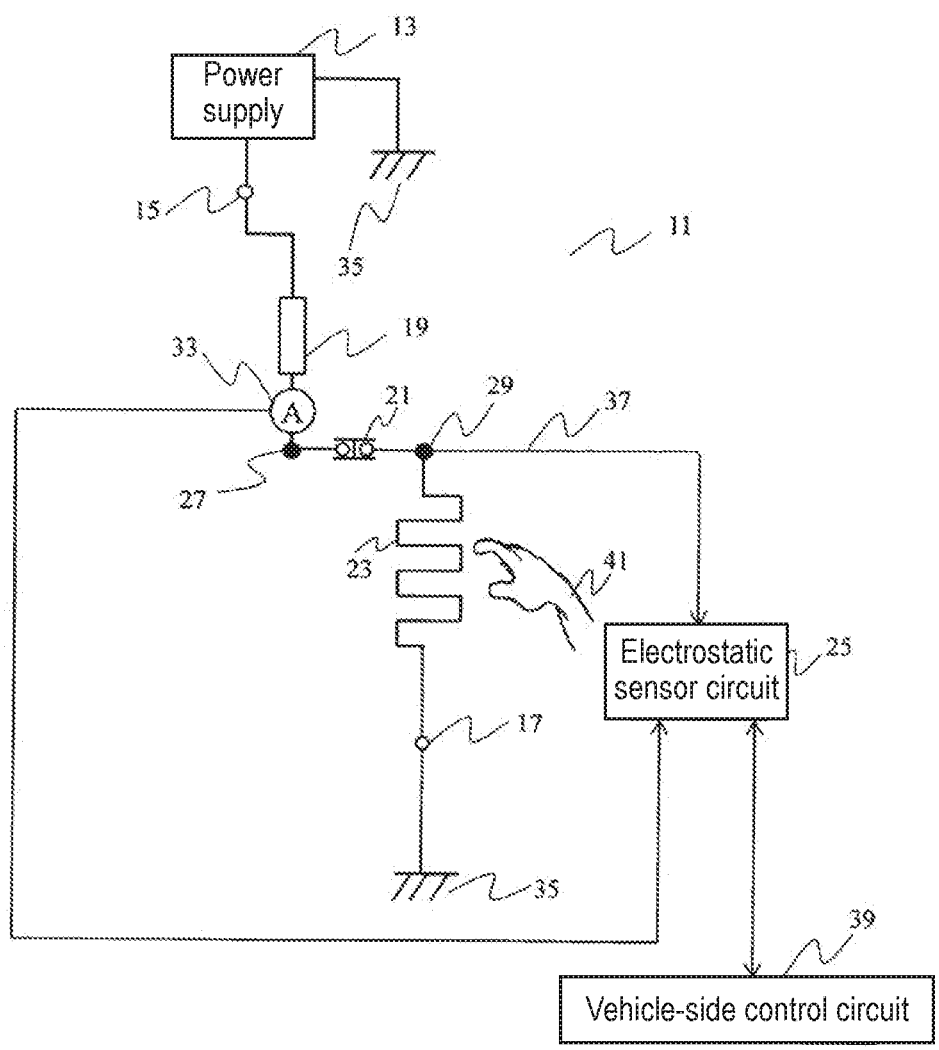
FIG. 12 Another block circuit diagram of the steering wheel grip detection device according to the first embodiment.
Figure 13:
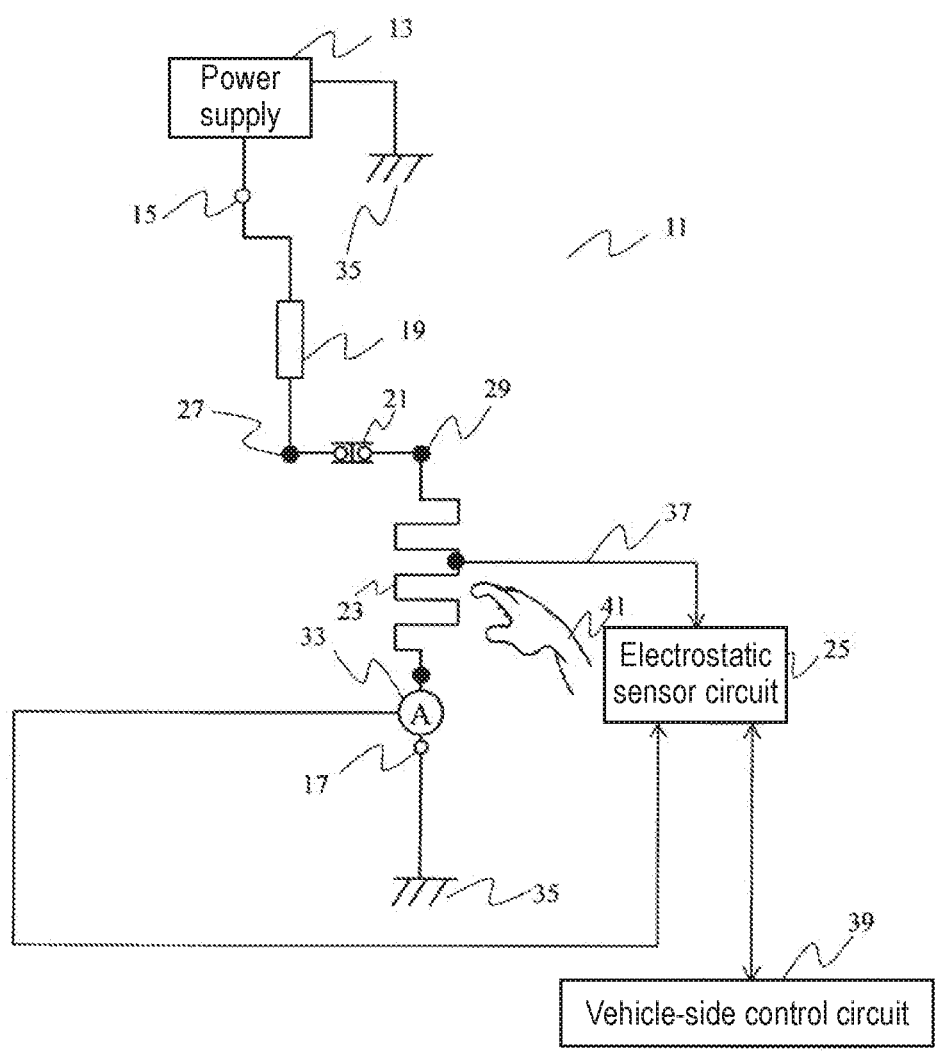
FIG. 13 Another block circuit diagram of the steering wheel grip detection device according to the first embodiment.

FIG. 1 is a schematic diagram of the inside of a cabin including a steering wheel grip detection device according to the first exemplary embodiment of the present disclosure. FIG. 2 is a block circuit diagram of the steering wheel grip detection device according to the first embodiment. FIG. 3 is another block circuit diagram of the steering wheel grip detection device according to the first embodiment. FIG. 4 is another block circuit diagram of the steering wheel grip detection device according to the first embodiment. FIG. 5 is another block circuit diagram of the steering wheel grip detection device according to the first embodiment. FIG. 6 is another block circuit diagram of the steering wheel grip detection device according to the first embodiment. FIG. 7 is another block circuit diagram of the steering wheel grip detection device according to the first embodiment. FIG. 8 is another block circuit diagram of the steering wheel grip detection device according to the first embodiment. FIG. 9 is a temporal characteristic diagram of the sensor capacitance of the steering wheel grip detection device according to the first embodiment. FIG. 10 is a temporal characteristic diagram of electrostatic sensor output of the steering wheel grip detection device according to the first embodiment. FIG. 11 is another block circuit diagram of the steering wheel grip detection device according to the first embodiment. FIG. 12 is another block circuit diagram of the steering wheel grip detection device according to the first embodiment. FIG. 13 is another block circuit diagram of the steering wheel grip detection device according to the first embodiment.

In FIG. 2, steering wheel grip detection device 11 has a series circuit including inductance element 19, thermostat 21 incorporated into the steering wheel, and heater 23 incorporated into the steering wheel, where the series circuit is electrically connected to between the positive and negative electrodes of power supply 13. Steering wheel grip detection device 11 further includes electrostatic sensor circuit 25 that is electrically connected to the end of heater 23 to which inductance element 19 is electrically connected, or to the middle of the wiring path of heater 23, to detect a grip of the steering wheel by means of an electric or electromagnetic field. Steering wheel grip detection device 11 is further provided with voltage detecting circuit 31 electrically connected to (1) between any one of connecting points 27 and 29 between inductance element 19, thermostat 21, and heater 23, and the wiring path of the positive electrode; (2) between any one of connecting points 27 and 29 and the wiring path of the negative electrode; (3) the two ends of inductance element 19; (4) the two ends of heater 23; or (5) the two ends of thermostat 21.

This structure allows the device to learn an open/closed state of thermostat 21 based on output of voltage detecting circuit 31, which reduces the influence of thermostat 21 on the detection of contact of steering wheel 3 with hand 41.

Note that the expression "voltage detecting circuit 31 is electrically connected to between any one of connecting points 27 and 29, and the wiring path of the positive electrode; or to between any one of connecting points 27 and 29, and the wiring path of the negative electrode" is defined as "one end of voltage detecting circuit 31 is electrically connected to any one of connecting point 27 or 29, and at the same time the other end of voltage detecting circuit 31 is electrically connected to the wiring path of the positive electrode or the wiring path of the negative electrode".

In FIG. 12, steering wheel grip detection device 11 has a series circuit including inductance element 19, thermostat 21 incorporated into the steering wheel, and heater 23 incorporated into the steering wheel, where the series circuit is electrically connected to between the positive and negative electrodes of power supply 13. Steering wheel grip detection device 11 further includes electrostatic sensor circuit 25 that is electrically connected to the end of heater 23 to which inductance element 19 is electrically connected, or to the middle of the wiring path of heater 23, to detect a grip of the steering wheel by means of an electric or electromagnetic field. Steering wheel grip detection device 11 is further provided with current detecting circuit 33 electrically series-connected to the wiring path of the series circuit.

Resultingly, in current detecting circuit 33 of the circuit configuration of FIG. 12, a current passes through heater 23 when thermostat 21 is closed; does not, when open. Accordingly, the output value of current detecting circuit 33 varies depending on an open/closed state of thermostat 21, allowing an output value to be detected. Thus, an open/closed state of thermostat 21 can be learned, which reduces the influence of thermostat 21 on the detection of contact of the steering wheel with hand 41.

Hereinafter, a more concrete description is made of the configuration and operation of the first embodiment.

FIG. 1 is a schematic diagram of the inside of a cabin inducing steering wheel grip detection device 11. Steering wheel 3 is placed near front window 2. Driver's seat 6 is placed near steering wheel 3, and passenger's seat 8 is placed next to driver's seat 6 with shift lever 7 disposed therebetween.

In FIG. 2, steering wheel grip detection device 11 is incorporated into the rim of steering wheel 3. Based on such a configuration, steering wheel grip detection device 11 detects whether or not hand 41 is gripping the rim of steering wheel 3 and outputs the result. Hereinafter, a detailed description is made of steering wheel grip detection device 11. Note that the expression "grip the rim of steering wheel 3" is simply described as "grip steering wheel 3."

In FIG. 2, power supply 13 supplies a current to work heater 23 (described later). Power supply 13 is a battery of the vehicle for example and has positive and negative electrodes. The positive electrode is electrically connected to positive electrode terminal 15; the negative electrode, to negative electrode terminal 17 through ground 35. Here, positive electrode terminal 15 and negative electrode terminal 17 are connector terminals for example for electrically connected to between the electrodes and power supply 13. However, the series circuit described below may be directly connected to the wiring path of the positive electrode or negative electrode, without at least one of such positive electrode terminal 15 and negative electrode terminal 17 provided.

To between positive electrode terminal 15 and negative electrode terminal 17, a series circuit is electrically connected including inductance element 19, thermostat 21, and heater 23, in this order from positive electrode terminal 15. Inductance element 19 is referred to an element having AC inductance; an inductor is used here. Thermostat 21 performs control so that heater 23 will not overheat. Concretely, thermostat 21 is disposed near heater 23 so that heat of heater 23 will be easily transmitted. The type of heater 23 is not especially limited; in the first embodiment, a heater wire is fixed on a nonwoven fabric by sewing.

To connecting point 29 in the wiring path from thermostat 21 to heater 23, electrostatic sensor circuit 25 is electrically connected that detects a grip of steering wheel 3 by means of an electric or electromagnetic field through sensor wire 37. Electrostatic sensor circuit 25 detects change of an electric or electromagnetic field in heater 23 due to contact with hand 41 through sensor wire 37 and outputs the result to an external circuit. In the first embodiment, the external circuit is vehicle-side control circuit 39. Accordingly, vehicle-side control circuit 39 learns contact of steering wheel 3 with hand 41 from an output signal from electrostatic sensor circuit 25. Vehicle-side control circuit 39 is configured to control various electric components incorporated into the vehicle; in FIG. 2, electric components are not shown.

A switch for turning on and off power to heater 23 according to a driver's intention is electrically connected to at least one of the wiring path from the positive electrode of power supply 13 to positive electrode terminal 15, and the wiring path from the negative electrode of power supply 13 to negative electrode terminal 17 for example. In FIG. 2, the switch is omitted. In the above-described configuration, steering wheel grip detection device 11 is defined as one that does not include power supply 13, vehicle-side control circuit 39, or the above-described switch.

Next, a description is made of outline operation of steering wheel grip detection device 11 in FIG. 2. First, basic operation of detecting a grip of a steering wheel is described. A grip of heater 23 with hand 41 causes the total capacitance of heater 23 to change due to the capacitance between hand 41 and heater 23, unlike a case where hand 41 does not grip heater 23. Electrostatic sensor circuit 25 detects the change by means of an electric or electromagnetic field through sensor wire 37. Then, electrostatic sensor circuit 25 outputs the detection result to vehicle-side control circuit 39. Such operation allows vehicle-side control circuit 39 to learn whether or not a driver is gripping steering wheel 3.

Next, a description is made of the detection of an open/closed state of thermostat 21. As shown in FIG. 2, voltage detecting circuit 31 is connected to connecting point 27 and negative electrode terminal 17, and thus voltage detecting circuit 31 is to be connected to the two ends of the series circuit including thermostat 21 and heater 23. If a voltage of power supply 13 is applied to steering wheel grip detection device 11 in this state, a partial voltage determined by the resistance values of inductance element 19 and heater 23 with reference to the potential at ground 35 when thermostat 21 is closed is applied to voltage detecting circuit 31. When thermostat 21 is open, a current does not flow through the series circuit, and thus a voltage of power supply 13 is applied to voltage detecting circuit 31. Accordingly, voltages detected by voltage detecting circuit 31 in response to an open/closed state of thermostat 21 basically varies, and thus the device learns an open/closed state of thermostat 21 based on output of voltage detecting circuit 31.

However, as a result that a driver or vehicle-side control circuit 39 does not use a high-power load of the vehicle, a voltage of power supply 13 may fluctuate. This fluctuation may influence the determination of an open/closed state of thermostat 21. Accordingly, the configuration of FIG. 2 represents that output of voltage detecting circuit 31 is input to electrostatic sensor circuit 25. Hence, electrostatic sensor circuit 25 multiplies a voltage value obtained by voltage detecting circuit 31 by the ratio of a voltage value of power supply 13 at the same time (being monitored by vehicle-side control circuit 39 and is introduced from vehicle-side control circuit 39) to a reference voltage (e.g., 12 V), and determines the product as a value converted from the reference voltage. The value reduces the influence of load fluctuation for determining an open/closed state of thermostat 21. Then, electrostatic sensor circuit 25 can output the result of determining whether hand 41 is in contact with heater 23 with the influence of an open/closed state of thermostat 21 reduced owing to correction (described later), to vehicle-side control circuit 39. Here, when power supply 13 is a constant-voltage source, the influence of the above-described load fluctuation does not need to be reduced.

Here, the configuration is described in which output of voltage detecting circuit 31 is connected to electrostatic sensor circuit 25; output of voltage detecting circuit 31 may be connected to vehicle-side control circuit 39. In this case, it is required that vehicle-side control circuit 39 reduces the influence of an open/closed state of thermostat 21 on output of electrostatic sensor circuit 25.

Next, a description is made of a configuration deformed from that of FIG. 2.

First, for a series circuit including inductance element 19, thermostat 21, and heater 23, there are six different orders of the components including the order of FIG. 2. Each order is described later in FIGS. 3 to 7.

Next, for a connection position of sensor wire 37 in the series circuit, sensor wire 37 is connected to connecting point 29 in FIG. 2. If sensor wire 37 is connected to positive electrode terminal 15, an AC signal for detecting the change of capacitance of electrostatic sensor circuit 25 flows to ground 35 through power supply 13, and does not flows to heater 23, and thus this configuration does not work. If sensor wire 37 is connected to connecting point 27, an AC signal does not flow to heater 23 when thermostat 21 is open, and thus this configuration does not work. If sensor wire 37 is connected to negative electrode terminal 17, an AC signal flows directly to the ground, and thus this configuration does not work. Accordingly, sensor wire 37 is connected to connecting point 29 as shown in FIG. 2.

Besides, sensor wire 37 may be connected to the middle of the wiring path of heater 23. This case is equivalent to a case where an inductance element including heater 23 is disposed at the two sides of sensor wire 37, and thus a case does not happen where an AC signal flows to the ground or does not flow to heater 23. Accordingly, the configuration in which sensor wire 37 is connected to the middle of the wiring path of heater 23 can be applied to any of the following cases. Details of this configuration is described in FIG. 11.

Next, connection of voltage detecting circuit 31 is described.

First, a description is made of a case where voltage detecting circuit 31 is connected to the two ends of each component. First, when voltage detecting circuit 31 is connected to the two ends of inductance element 19, a current from power supply 13 does not flow if thermostat 21 is open, and thus equivalent voltages are applied to the two ends of inductance element 19. Accordingly, voltage detecting circuit 31 connected to the two ends outputs 0 V. Meanwhile, if thermostat 21 is closed, a current from power supply 13 flows, and thus a voltage corresponding to the difference between the voltage of power supply 13 and the partial voltage determined by inductance element 19 and heater 23 is applied to voltage detecting circuit 31. Accordingly, a voltage corresponding to the above-described difference is output from voltage detecting circuit 31. Hence, even a configuration in which voltage detecting circuit 31 is connected to the two ends of inductance element 19 allows learning an open/closed state of thermostat 21.

Next, when voltage detecting circuit 31 is connected to the two ends of thermostat 21, a voltage of power supply 13 is applied to the end of thermostat 21 close to power supply 13 if thermostat is open. This leads to the end of thermostat 21 close to heater 23 connected to ground 35, and thus output of voltage detecting circuit 31 is equal to a voltage of power supply 13. Meanwhile, if thermostat 21 is closed, the two ends of thermostat 21 have an equivalent potential, and thus voltage detecting circuit 31 outputs 0 V. Hence, even a configuration in which voltage detecting circuit 31 is connected to the two ends of thermostat 21 allows learning an open/closed state of thermostat 21.

Next, when voltage detecting circuit 31 is connected to the two ends of heater 23, a current from power supply 13 does not flow if thermostat 21 is open, and thus equivalent voltages are applied to the two ends of heater 23. Accordingly, voltage detecting circuit 31 connected to the two ends outputs 0 V. Meanwhile, if thermostat 21 is closed, a current from power supply 13 flows, and thus a voltage corresponding to a partial voltage determined by inductance element 19 and heater 23 is applied to voltage detecting circuit 31. Hence, even a configuration in which voltage detecting circuit 31 is connected to the two ends of heater 23 allows learning an open/closed state of thermostat 21.

Next, when voltage detecting circuit 31 is connected to between positive electrode terminal 15 and connecting point 29, a current does not flow from power supply 13 if thermostat 21 is open. Accordingly, a voltage of power supply 13 is applied to the two ends of inductance element 19, and connecting point 29 has the potential at ground 35. Accordingly, voltage detecting circuit 31 connected to positive electrode terminal 15 and connecting point 29 outputs a voltage of power supply 13 with reference to the potential at ground 35. Meanwhile, if thermostat 21 is closed, a current from power supply 13 flows, and thus a voltage corresponding to the difference between the voltage of power supply 13 and the partial voltage determined by inductance element 19 and heater 23 is applied to voltage detecting circuit 31. Accordingly, a voltage corresponding to the above-described difference is output from voltage detecting circuit 31. Hence, even a configuration in which voltage detecting circuit 31 is connected to between positive electrode terminal 15 and connecting point 29 allows learning an open/closed state of thermostat 21.

The description is made above of a configuration in which voltage detecting circuit 31 is connected to between connecting point 27 and negative electrode terminal 17, and thus its description is omitted.

In summary, it is appropriate that voltage detecting circuit 31 is configured to be electrically connected to between any connecting point 27 or 29 in the series circuit including inductance element 19, thermostat 21, and heater 23, in this order; and the wiring path of the positive electrode (e.g., positive electrode terminal 15). Alternatively, it is appropriate that voltage detecting circuit 31 is configured to be electrically connected to between any connecting point 27 or 29; and the wiring path of the negative electrode (e.g., negative electrode terminal 17). Otherwise, it is appropriate that voltage detecting circuit 31 is configured to be electrically connected to the two ends of inductance element 19, to the two ends of heater 23, or to the two ends of thermostat 21.

Next, a description is made of the configuration in which the series circuit has inductance element 19, heater 23, and thermostat 21, connected in this order from positive electrode terminal 15 toward negative electrode terminal 17.

First, sensor wire 37 is connected to connecting point 27 as shown in FIG. 3. Hence, an AC signal output from electrostatic sensor circuit 25 to detect capacitance change does not flow to ground 35 (including the wiring series passing through power supply 13) due to the inductance of inductance element 19 and heater 23. Accordingly, the configuration of sensor wire 37 connected to connecting point 27 can detect a grip. Meanwhile, if sensor wire 37 is connected to connecting point 29, electrostatic sensor circuit 25 is directly connected to ground 35 when thermostat 21 is closed, and thus an AC signal results in flowing to ground 35. Hence, the configuration of FIG. 3 requires sensor wire 37 to be connected to connecting point 27.

Next, a description is made of connection of voltage detecting circuit 31. The series circuit in FIG. 3 is different from that in FIG. 2 only in that heater 23 and thermostat 21 are replaced with each other. Accordingly, with the configuration in which voltage detecting circuit 31 is connected to the two ends of each component, an open/closed state of thermostat 21 can be determined in the same way as described in FIG. 2. If voltage detecting circuit 31 is connected to between positive electrode terminal 15 and connecting point 29, a current does not flow from power supply 13 when thermostat 21 is open, and thus the two ends of voltage detecting circuit 31 have equivalent potentials, and voltage detecting circuit 31 outputs 0 V. When thermostat 21 is closed, connecting point 29 is connected to ground 35, and thus a voltage of power supply 13 with reference to the potential at ground 35 is applied to the two ends of voltage detecting circuit 31, which outputs the voltage value. Hence, voltage detecting circuit 31 outputs different voltage values depending on whether thermostat 21 is open or closed, which allows an open/closed state of thermostat 21 to be determined Meanwhile, as shown in FIG. 3, a configuration in which voltage detecting circuit 31 is electrically connected to between connecting point 27 and negative electrode terminal 17 works as follows. When thermostat 21 is open, a voltage of power supply 13 with reference to the potential at ground 35 is applied to the two ends of voltage detecting circuit 31, which outputs the voltage value. When thermostat 21 is closed, a partial voltage corresponding to the resistance values of inductance element 19 and heater 23 is applied to the two ends of voltage detecting circuit 31, which outputs a voltage value corresponding to the partial voltage. Accordingly, voltage detecting circuit 31 outputs different voltage values depending on whether thermostat 21 is open or closed, which allows an open/closed state of thermostat 21 to be determined.

From these circumstances, it is appropriate that voltage detecting circuit 31 is electrically connected between any connecting point 27 or 29 in the series circuit including inductance element 19, heater 23, and thermostat 21, in this order; and the wiring path of the positive electrode (e.g., positive electrode terminal 15). Alternatively, it is appropriate that voltage detecting circuit 31 is electrically connected between any connecting point 27 or 29; and the wiring path of the negative electrode (e.g., negative electrode terminal 17). Otherwise, it is appropriate that voltage detecting circuit 31 is configured to be electrically connected to the two ends of inductance element 19, to the two ends of heater 23, or to the two ends of thermostat 21.

Next, a description is made of the configuration in which the series circuit has thermostat 21, inductance element 19, and heater 23, connected in this order from positive electrode terminal 15 toward negative electrode terminal 17.

First, sensor wire 37 is connected to connecting point 29 as shown in FIG. 4. Hence, an AC signal output from electrostatic sensor circuit 25 to detect capacitance change does not flow to ground 35 (including the wiring series passing through power supply 13) due to the inductance of inductance element 19 and heater 23. Accordingly, the configuration of sensor wire 37 connected to connecting point 29 can detect a grip. Meanwhile, if sensor wire 37 is connected to connecting point 27, electrostatic sensor circuit 25 is connected to ground 35 thorough power supply 13 when thermostat 21 is closed, and thus an AC signal results in flowing to ground 35. Hence, the configuration of FIG. 4 requires sensor wire 37 to be connected to connecting point 29.

Next, a description is made of connection of voltage detecting circuit 31. The series circuit in FIG. 4 is different from that in FIG. 2 only in that inductance element 19 and thermostat 21 are replaced with each other. Accordingly, with the configuration in which voltage detecting circuit 31 is connected to the two ends of each component, an open/closed state of thermostat 21 can be determined in the same way as described in FIG. 2. If voltage detecting circuit 31 is connected to between positive electrode terminal 15 and connecting point 29, a current does not flow from power supply 13 when thermostat 21 is open, and thus a voltage of power supply 13 with reference to the potential at ground 35 is applied to the two ends of voltage detecting circuit 31, which outputs the voltage value. When thermostat 21 is closed, a current flows from power supply 13, and thus a voltage at connecting point 29 represents a partial voltage determined by the resistance values of inductance element 19 and heater 23. Accordingly, voltage detecting circuit 31 is connected to between positive electrode terminal 15 and connecting point 29, and thus the difference voltage between a voltage at positive electrode terminal 15 (a voltage of power supply 13) and a voltage at connecting point 29 is output. Hence, voltage detecting circuit 31 outputs different voltage values depending on whether thermostat 21 is open or closed, which allows an open/closed state of thermostat 21 to be determined Meanwhile, as shown in FIG. 4, a configuration in which voltage detecting circuit 31 is electrically connected to between connecting point 27 and negative electrode terminal 17 works as follows. When thermostat 21 is open, the two ends of voltage detecting circuit 31 have a potential at ground 35, and thus voltage detecting circuit 31 outputs 0 V. When thermostat 21 is closed, a voltage of power supply 13 with reference to the potential at ground 35 is applied to the two ends of voltage detecting circuit 31, which outputs the voltage value. Accordingly, voltage detecting circuit 31 outputs different voltage values depending on whether thermostat 21 is open or closed, which allows an open/closed state of thermostat 21 to be determined.

From these circumstances, it is appropriate that voltage detecting circuit 31 is electrically connected between any connecting point 27 or 29 in the series circuit including thermostat 21, inductance element 19, and heater 23, in this order; and the wiring path of the positive electrode (e.g., positive electrode terminal 15). Alternatively, it is appropriate that voltage detecting circuit 31 is electrically connected between any connecting point 27 or 29; and the wiring path of the negative electrode (e.g., negative electrode terminal 17). Otherwise, it is appropriate that voltage detecting circuit 31 is configured to be electrically connected to the two ends of inductance element 19, to the two ends of heater 23, or to the two ends of thermostat 21.

Next, a description is made of the configuration in which the series circuit has thermostat 21, heater 23, and inductance element 19 connected in this order from positive electrode terminal 15 toward negative electrode terminal 17.

First, sensor wire 37 is connected to connecting point 29 as shown in FIG. 5. Hence, an AC signal output from electrostatic sensor circuit 25 to detect capacitance change does not flow to ground 35 (including the wiring series passing through power supply 13) due to the inductance of inductance element 19 and heater 23. This is the same as that of FIG. 4. Accordingly, the configuration of sensor wire 37 connected to connecting point 29 can detect a grip. Meanwhile, if sensor wire 37 is connected to connecting point 27, electrostatic sensor circuit 25 is connected to ground 35 thorough power supply 13 when thermostat 21 is closed in the same way as the configuration of FIG. 4, and thus an AC signal results in flowing to ground 35. Hence, the configuration of FIG. 5 also requires sensor wire 37 to be connected to connecting point 29.

Next, a description is made of connection of voltage detecting circuit 31. The series circuit in FIG. 5 is different from that in FIG. 4 only in that inductance element 19 and heater 23 are replaced with each other. Accordingly, with the configuration in which voltage detecting circuit 31 is connected to the two ends of each component, an open/closed state of thermostat 21 can be determined in the same way as described in FIG. 4. If voltage detecting circuit 31 is connected to between positive electrode terminal 15 and connecting point 29, a current does not flow from power supply 13 when thermostat 21 is open, and thus a voltage of power supply 13 with reference to the potential at ground 35 is applied to the two ends of voltage detecting circuit 31, which outputs the voltage value. When thermostat 21 is closed, a current flows from power supply 13, and thus a voltage at connecting point 29 represents a partial voltage determined by the resistance values of inductance element 19 and heater 23. Accordingly, voltage detecting circuit 31 is connected to between positive electrode terminal 15 and connecting point 29, and thus the difference voltage between a voltage at positive electrode terminal 15 (a voltage of power supply 13) and a voltage at connecting point 29 is output. Hence, voltage detecting circuit 31 outputs different voltage values depending on whether thermostat 21 is open or closed, which allows an open/closed state of thermostat 21 to be determined Meanwhile, as shown in FIG. 5, a configuration in which voltage detecting circuit 31 is electrically connected to between connecting point 27 and negative electrode terminal 17 works as follows. When thermostat 21 is open, the two ends of voltage detecting circuit 31 have a potential at ground 35, and thus voltage detecting circuit 31 outputs 0 V. When thermostat 21 is closed, a voltage of power supply 13 with reference to the potential at ground 35 is applied to the two ends of voltage detecting circuit 31, which outputs the voltage value. Accordingly, voltage detecting circuit 31 outputs different voltage values depending on whether thermostat 21 is open or closed, which allows an open/closed state of thermostat 21 to be determined.

From these circumstances, it is appropriate that voltage detecting circuit 31 is electrically connected between any connecting point 27 or 29 in the series circuit including thermostat 21, heater 23, and inductance element 19, in this order; and the wiring path of the positive electrode (e.g., positive electrode terminal 15). Alternatively, it is appropriate that voltage detecting circuit 31 is electrically connected between any connecting point 27 or 29; and the wiring path of the negative electrode (e.g., negative electrode terminal 17). Otherwise, it is appropriate that voltage detecting circuit 31 is configured to be electrically connected to the two ends of inductance element 19, to the two ends of heater 23, or to the two ends of thermostat 21.

Next, a description is made of the configuration in which the series circuit has heater 23, thermostat 21, and inductance element 19 connected in this order from positive electrode terminal 15 toward negative electrode terminal 17.

First, sensor wire 37 is connected to connecting point 27 as shown in FIG. 6. Hence, when thermostat 21 is closed, an AC signal output from electrostatic sensor circuit 25 to detect capacitance change does not flow to ground 35 (including a wiring series passing through power supply 13) due to the inductance of inductance element 19 and heater 23. When thermostat 21 is open, the connection between connecting point 27 and ground 35 is cut off and at the same time heater 23 has inductance, and thus an AC signal does not flow to ground 35. Accordingly, the configuration of sensor wire 37 connected to connecting point 27 can detect a grip. Meanwhile, if sensor wire 37 is connected to connecting point 29, an AC signal for detecting a grip ceases to flow to heater 23 when thermostat 21 opens. Hence, the configuration of FIG. 6 requires sensor wire 37 to be connected to connecting point 27.

Next, a description is made of connection of voltage detecting circuit 31. The series circuit in FIG. 6 is different from that in FIG. 2 only in that inductance element 19 and heater 23 are replaced with each other. Accordingly, with the configuration in which voltage detecting circuit 31 is connected to the two ends of each component, an open/closed state of thermostat 21 can be determined in the same way as described in FIG. 2. If voltage detecting circuit 31 is connected to between positive electrode terminal 15 and connecting point 29, a current does not flow from power supply 13 when thermostat 21 is open, and thus connecting point 29 has the potential at ground 35. Accordingly, voltage detecting circuit 31 connected to positive electrode terminal 15 and connecting point 29 outputs a voltage of power supply 13 with reference to the potential at ground 35. When thermostat 21 is closed, a current flows from power supply 13, and thus a voltage at connecting point 29 represents a partial voltage determined by the resistance values of inductance element 19 and heater 23. Accordingly, voltage detecting circuit 31 is connected to between positive electrode terminal 15 and connecting point 29, and thus the difference voltage between a voltage at positive electrode terminal 15 (a voltage of power supply 13) and a voltage at connecting point 29 is output. Hence, voltage detecting circuit 31 outputs different voltage values depending on whether thermostat 21 is open or closed, which allows an open/closed state of thermostat 21 to be determined Meanwhile, as shown in FIG. 6, a configuration in which voltage detecting circuit 31 is electrically connected to between connecting point 27 and negative electrode terminal 17 works as follows. If thermostat 21 is closed, a current flows through the series circuit, and thus a voltage at connecting point 27 represents a partial voltage determined by the resistance values of inductance element 19 and heater 23. Accordingly, voltage detecting circuit 31 is connected to between positive electrode terminal 15 and connecting point 29, and thus the difference voltage between a voltage at positive electrode terminal 15 (a voltage of power supply 13) and a voltage at connecting point 29 is output. Hence, voltage detecting circuit 31 outputs different voltage values depending on whether thermostat 21 is open or closed, which allows an open/closed state of thermostat 21 to be determined Meanwhile, as shown in FIG. 6, a configuration in which voltage detecting circuit 31 is electrically connected to between connecting point 27 and negative electrode terminal 17 works as follows. If thermostat 21 is closed, a current flows through the series circuit, and thus a voltage at connecting point 27 represents a partial voltage determined by the resistance values of heater 23 and inductance element 19. Accordingly, a partial voltage with reference to the potential at ground 35 is applied to the two ends of voltage detecting circuit 31, which outputs the voltage applied as a voltage value. If thermostat 21 is open, a voltage of power supply 13 with reference to the potential at ground 35 is applied to the two ends of voltage detecting circuit 31, which outputs the voltage value. Accordingly, voltage detecting circuit 31 outputs different voltage values depending on whether thermostat 21 is open or closed, which allows an open/closed state of thermostat 21 to be determined.

From these circumstances, it is appropriate that voltage detecting circuit 31 is electrically connected between any connecting point 27 or 29 in the series circuit including heater 23, thermostat 21, and inductance element 19, in this order; and the wiring path of the positive electrode (e.g., positive electrode terminal 15). Alternatively, it is appropriate that voltage detecting circuit 31 is electrically connected between any connecting point 27 or 29; and the wiring path of the negative electrode (e.g., negative electrode terminal 17). Otherwise, it is appropriate that voltage detecting circuit 31 is configured to be electrically connected to the two ends of inductance element 19, to the two ends of heater 23, or to the two ends of thermostat 21.

Next, a description is made of the configuration in which the series circuit has heater 23, inductance element 19, and thermostat 21 connected in this order from positive electrode terminal 15 toward negative electrode terminal 17.

First, sensor wire 37 is connected to connecting point 27 as shown in FIG. 7. an AC signal output from electrostatic sensor circuit 25 to detect capacitance change does not flow to ground 35 (including a wiring series passing through power supply 13) due to the inductance of inductance element 19 and heater 23. Accordingly, the configuration of sensor wire 37 connected to connecting point 27 can detect a grip. Meanwhile, if sensor wire 37 is connected to connecting point 29, electrostatic sensor circuit 25 is directly connected to ground 35 when thermostat 21 closes, and thus an AC signal results in flowing to ground 35. Hence, the configuration of FIG. 7 requires sensor wire 37 to be connected to connecting point 27 in the same way as that of FIG. 3.

Next, a description is made of connection of voltage detecting circuit 31. The series circuit in FIG. 7 is different from that in FIG. 3 only in that heater 23 and inductance element 19 are replaced with each other. Accordingly, with the configuration in which voltage detecting circuit 31 is connected to the two ends of each component, an open/closed state of thermostat 21 is determined in the same way as described in FIG. 3. If voltage detecting circuit 31 is connected to between positive electrode terminal 15 and connecting point 29, a current does not flow from power supply 13 if thermostat 21 is open, and thus the two ends of voltage detecting circuit 31 have equivalent potentials, and voltage detecting circuit 31 outputs 0 V. If thermostat 21 is closed, connecting point 29 is connected to ground 35, and thus a voltage of power supply 13 with reference to the potential at ground 35 is applied to the two ends of voltage detecting circuit 31, which outputs the voltage value. Hence, voltage detecting circuit 31 outputs different voltage values depending on whether thermostat 21 is open or closed, which allows an open/closed state of thermostat 21 to be determined Meanwhile, as shown in FIG. 7, a configuration in which voltage detecting circuit 31 is electrically connected to between connecting point 27 and negative electrode terminal 17 works as follows. If thermostat 21 is open, a voltage of power supply 13 with reference to the potential at ground 35 is applied to the two ends of voltage detecting circuit 31, which outputs the voltage value. If thermostat 21 is closed, a partial voltage corresponding to the resistance value of inductance element 19 and heater 23 is applied to the two ends of voltage detecting circuit 31, which outputs a voltage value corresponding to the partial voltage. Accordingly, voltage detecting circuit 31 outputs different voltage values depending on whether thermostat 21 is open or closed, which allows an open/closed state of thermostat 21 to be determined.

From these circumstances, it is appropriate that voltage detecting circuit 31 is electrically connected between any connecting point 27 or 29 in the series circuit including heater 23, inductance element 19, and thermostat 21, in this order; and the wiring path of the positive electrode (e.g., positive electrode terminal 15). Alternatively, it is appropriate that voltage detecting circuit 31 is electrically connected between any connecting point 27 or 29; and the wiring path of the negative electrode (e.g., negative electrode terminal 17). Otherwise, it is appropriate that voltage detecting circuit 31 is configured to be electrically connected to the two ends of inductance element 19, to the two ends of heater 23, or to the two ends of thermostat 21.

Hereinbefore, the detailed description is made, with reference to FIGS. 2 through 7, of six patterns of the series circuit in the basic configuration of steering wheel grip detection device 11, and the connection positions of sensor wire 37 and voltage detecting circuit 31 for each pattern. The connection positions are summarized as follows.

First, sensor wire 37 electrically connected to electrostatic sensor circuit 25 is electrically connected to the end of heater 23 to which inductance element 19 is electrically connected, or to the middle of the wiring path of heater 23. This means that sensor wire 37 has an optimum connection position according to a configuration of the series circuit. Here, "the end of heater 23 to which inductance element 19 is electrically connected" refers to connecting point 29 in the configuration of FIG. 2 for example. Connecting point 27 in FIG. 2 is positioned at the end of heater 23 to which inductance element 19 is electrically connected. However, thermostat 21 is connected to between heater 23 and connecting point 27, and thus connecting point 27 does not correspond to an end of heater 23. As a result, an end of heater 23 is defined as any part in a wiring path from an end of heater 23 to a circuit component.

A connection position of voltage detecting circuit 31 may be either of the following two positions for whichever one of six patterns of the series circuit shown in FIGS. 2 through 7. One is the two ends of one of the three components: inductance element 19, thermostat 21, and heater 23. The other is the two ends of the series circuit directly connected to any two components of the three. Hence, a connection position of voltage detecting circuit 31 has a higher flexibility than that of sensor wire 37.

Hereinbefore, the description is made of a basic configuration and operation of steering wheel grip detection device 11. Next, a detailed description is made of operation and other configurations.

Steering wheel grip detection device 11 shown in FIG. 8 is equivalent to the configuration in FIG. 2. What is different from FIG. 2 is as follows. In FIG. 2, voltage detecting circuit 31 is connected to between connecting point 27 and negative electrode terminal 17. In FIG. 8, connection to negative electrode terminal 17 in FIG. 2 is made on the wiring path between heater 23 and negative electrode terminal 17. In this way, connection of voltage detecting circuit 31 is not limited to connection to connecting point 27 or to negative electrode terminal 17, but connection may be made on the wiring path between heater 23 and negative electrode terminal 17 described above due to the structure of heater 23 for example. Connection of connecting point 27 may be made on the wiring path from thermostat 21 to inductance element 19. Besides, connection of sensor wire 37 is not limited to connection to connecting point 29, but connection may be made on the wiring path from thermostat 21 to heater 23. Here, these manners are applied to any configuration of FIGS. 2 through 7, as well as to other configurations described hereinafter. Next, FIG. 9 shows a temporal characteristic diagram of the sensor capacitance in steering wheel grip detection device 11 of FIG. 8. Here, the sensor capacitance refers to a capacitance value detected by electrostatic sensor circuit 25 through heater 23. In FIG. 9, the horizontal axis represents time; the vertical axis represents sensor capacitance. FIG. 9 is a temporal characteristic diagram in a case of a large detection error because electrostatic sensor circuit 25 does not know an open/closed state of thermostat 21. In FIG. 9, the sensor capacitance changes as follows. The value is first sensor capacitance value C1 if thermostat 21 is open for example. The value sharply increases when thermostat 21 closes at time t1 to reach second sensor capacitance value C2. Such a rapid change is larger than the change of the sensor capacitance in a state where heater 23 becomes touched with hand 41 from a state of heater 23 untouched. Hence, opening and closing of thermostat 21 cause a detection error.

FIG. 10 is a temporal characteristic diagram of electrostatic sensor output of steering wheel grip detection device 11. In FIG. 10, the horizontal axis represents time: the vertical axis represents electrostatic sensor output. Here, electrostatic sensor output refers to an output signal from electrostatic sensor circuit 25. FIG. 10, similarly to FIG. 9, is a temporal characteristic diagram in a case of a large detection error because electrostatic sensor circuit 25 does not know an open/closed state of thermostat 21. In FIG. 10, the average value of output values (referred to as a sensor value hereinafter) is value A when thermostat 21 is open for example. However, the electrostatic sensor output sharply increases when thermostat 21 closes at time t1, and the average value of sensor values reaches value B. Here, electrostatic sensor output fluctuates in a short cycle, which is due to noise. In this way, as a result that the sensor capacitance of FIG. 9 rapidly changes, the electrostatic sensor output rapidly changes as well at time t1 as shown in FIG. 10. Due to the electrostatic sensor output thus changing, detecting whether or not hand 41 is in touch with heater 23 proves to cause a large error, which requires an open/closed state of thermostat 21 to be detected.

Hence, electrostatic sensor circuit 25 determines an open/closed state of thermostat 21 using a voltage value output from voltage detecting circuit 31 as follows. First, when the switch is on and thermostat 21 is closed, a current flows through the series circuit. Accordingly, a voltage is substantially applied that is produced by dividing a voltage of power supply 13 by the DC resistance values of inductance element 19 and heater 23, to voltage detecting circuit 31 electrically connected to the two ends of heater 23. This voltage value is input to electrostatic sensor circuit 25. Here, a voltage value detected by voltage detecting circuit 31 is subject to the fluctuation of a voltage of power supply 13. Hence, electrostatic sensor circuit 25 corrects the voltage divided based on the ratio of a voltage of power supply 13 obtained from vehicle-side control circuit 39 to the predetermined reference voltage. Hereinafter, a voltage value obtained from voltage detecting circuit 31 is corrected in this way.

Meanwhile, when thermostat 21 is open, a current hardly flows through the series circuit. Accordingly, a voltage value of power supply 13 is applied to voltage detecting circuit 31, which then outputs this voltage value to electrostatic sensor circuit 25.

Based on these results, electrostatic sensor circuit 25 learns an open/closed state of thermostat 21 from the fact that voltage detecting circuit 31 outputs different voltage values depending on whether thermostat 21 is open or closed. Specifically, sensor values are measured preliminarily in open and closed states of thermostat 21. The amount of the change (an offset value) of the sensor values are determined and retained. Electrostatic sensor circuit 25 adds or subtracts the amount of the change (an offset value) of the sensor values determined and retained corresponding to a large change of the electrostatic sensor output due to an open/closed state of thermostat 21 as shown in FIG. 10, to and from the sensor value detected by electrostatic sensor circuit 25. This allows the influence of thermostat 21 to be reduced. Concretely, the process is as follows. The sensor value is value A when thermostat 21 is open before time t1 in FIG. 10. When thermostat 21 closes at time t1, electrostatic sensor circuit 25 detects the change from output of voltage detecting circuit 31, and subtracts an offset value (value B−value A) preliminarily retained from the sensor value. Resultingly, the offset value (value B−value A) is subtracted from the sensor value (value B), which is a value not corrected after time t1, and thus the sensor value is value A even after time t1. This reduces the influence of an open/closed state of thermostat 21. The electrostatic sensor output thus corrected is output to vehicle-side control circuit 39. To operate as described above, electrostatic sensor circuit 25 incorporates a peripheral circuit including interface with voltage detecting circuit 31 and vehicle-side control circuit 39; and a microprocessor for performing correction.

Note that the above-described correction operation is executed by a microprocessor, but not limited; it may be executed only by an analog circuit.

To further reduce the influence of voltage fluctuation of power supply 13, the offset value may be corrected according to a voltage value of power supply 13.

The offset value preliminarily retained may be a value based on an actually measured value of an offset value generated due to change of a sensor value caused by the previous opening and closing of thermostat 21. Concretely, the offset value preliminarily retained may be the average value of previous offset values actually measured and stored; and an offset value actually measured this time. In this case, to calculate an offset value actually measured this time, electrostatic sensor circuit 25 continues to output a sensor value immediately before an open/closed state of thermostat 21 changes. Then, electrostatic sensor circuit 25 averages previous offset values actually measured and an offset value actually measured this time to determine an offset value. Subsequently, electrostatic sensor circuit 25 corrects the sensor value using the offset value obtained. This allows temporal fluctuation of an offset value to be reduced.

Further, the temperature of heater 23 varies due to hysteresis between when thermostat 21 closes from an open state and when opens from a closed state. The hysteresis may cause an offset value to vary. On this occasion, electrostatic sensor circuit 25 may preliminarily retain two offset values for a case of thermostat 21 from open to closed and from closed to open to perform correction using an offset value corresponding to operating state of thermostat 21.

Here, a description is made of another configuration of the first embodiment using FIG. 11. This configuration is different from that of FIG. 8 as follows. First, voltage detecting circuit 31 is directly connected to the two ends of heater 23. Such a configuration allows voltage detecting circuit 31 to detect a voltage between the two ends of heater 23 more accurately, and thus electrostatic sensor circuit 25 reduces the influence of opening and closing of thermostat 21 well precisely.

Next, the configuration of FIG. 11 is different from that of FIG. 8 in that electrostatic sensor circuit 25 is connected to the middle of the wiring path of heater 23 through sensor wire 37. Here, the middle of the wiring path of heater 23 is not limited to the center of the wiring path of heater 23. Connecting sensor wire 37 even in this way yields electrostatic sensor output similarly to the configuration of FIG. 8. This is because an inductance element is present that is formed by a wiring path composing heater 23 at both sides of the connecting point of sensor wire 37 with heater 23. Here, if sensor wire 37 is connected to the wiring path from the end of heater 23 close to ground 35 to negative electrode terminal 17, an AC signal for measuring a grip of hand 41 results in flowing to ground 35, disabling detection at heater 23. Hence, sensor wire 37 is required not to be connected to the wiring path from the end of heater 23 close to ground 35 to negative electrode terminal 17.

In the configuration of FIG. 8 or 11, voltage detecting circuit 31 may be electrically connected to the two ends of inductance element 19 as described in the configurations from FIGS. 2 to 7. In this case, when thermostat 21 is closed, voltage detecting circuit 31 outputs a voltage value that is the difference between a voltage of power supply 13 and a partial voltage produced by dividing a voltage of power supply 13 by the series circuit of inductance element 19 and heater 23. When thermostat 21 is open, voltage detecting circuit 31 outputs 0 V because the two ends of voltage detecting circuit 31 have an equivalent voltage.

In the configuration of FIG. 11, two changes have been made to the configuration of FIG. 8, where either one of them may be made.

Next, a description is made of still another configuration of the first embodiment using FIG. 12.

In FIG. 12, steering wheel grip detection device 11 has a series circuit including inductance element 19, thermostat 21 incorporated into the steering wheel, and heater 23 incorporated into the steering wheel, and is electrically connected to between the positive and negative electrodes of power supply 13. Steering wheel grip detection device 11 further includes electrostatic sensor circuit 25 that is electrically connected to the end of heater 23 to which inductance element 19 is electrically connected, or to the middle of the wiring path of heater 23, to detect a grip of the steering wheel by means of an electric or electromagnetic field. Steering wheel grip detection device 11 is further provided with current detecting circuit 33 electrically series-connected to the wiring path of the series circuit.

Resultingly, a current does not flow through the series circuit when thermostat 21 is open, and thus current detecting circuit 33 outputs approximately 0 A in the allowable margin of error. Hence, a current flows through the series circuit when thermostat 21 is closed, and thus current detecting circuit 33 outputs a current value determined by a voltage of power supply 13 and the direct-current resistances of inductance element 19 and heater 23. Accordingly, electrostatic sensor circuit 25 learns an open/closed state of thermostat 21 from the fact that current detecting circuit 33 outputs different voltage values depending on whether thermostat 21 is open or closed.

Hereinafter, a description is made of further details about the operation and the configuration of FIG. 12.

First, what is different from the configuration of FIG. 8 is that current detecting circuit 33 is provided instead of voltage detecting circuit 31. Current detecting circuit 33 is electrically connected into the wiring path of the series circuit. In FIG. 12, current detecting circuit 33 is connected to the wiring path between inductance element 19 and thermostat 21. Current detecting circuit 33 is also electrically connected to electrostatic sensor circuit 25 to output a current value detected to electrostatic sensor circuit 25. Sensor wire 37 is connected to an optimum position determined by the order of the circuit components in the series circuit similarly to FIGS. 2 through 7.

A description is made of how such a configuration detects an open/closed state of thermostat 21. On this occasion, the switch is assumed to be on. First, when thermostat 21 is closed, a current from power supply 13 flows to heater 23. Accordingly, current detecting circuit 33 detects a current value determined by a voltage of power supply 13 and the direct-current resistances of inductance element 19 and heater 23, and then outputs the current value to electrostatic sensor circuit 25.

Meanwhile, when thermostat 21 is open, a current hardly flows, and thus current detecting circuit 33 outputs a current value of approximately 0 A.

From these actions, a current value indicates an open/closed state of thermostat 21, which allows electrostatic sensor circuit 25 to reduce the influence of thermostat 21.

Next, a description is made of still another configuration of the first embodiment using FIG. 13 instead of FIG. 12. What is different from the configuration of FIG. 12 is first that current detecting circuit 33 is provided in the wiring path from the end of heater 23 close to ground 35 to negative electrode terminal 17. This structure also allows an open/closed state of thermostat 21 to be known, which is because the same current value is obtained wherever in the series circuit current detecting circuit 33 is provided. Current detecting circuit 33 proves to have greater flexibility in the position in the circuit than voltage detecting circuit 31.

Next, what is different from the configuration of FIG. 12 is that sensor wire 37 is connected to the middle of the wiring path of heater 23. This configuration is the same as that of FIG. 11, as well as advantages available, and thus a detailed description omitted.

In the configuration of FIG. 13, two changes have been made to the configuration of FIG. 12, where either one of them may be made.

In the configuration of FIGS. 12 and 13, it is appropriate that correction for an open/closed state of thermostat 21 is made similarly to the case where an open/closed state of thermostat 21 is detected from output of voltage detecting circuit 31. That is, output of current detecting circuit 33 is electrically connected to electrostatic sensor circuit 25, which can detect an open/closed state of thermostat 21. Then, electrostatic sensor circuit 25, retaining an offset value, adds and subtracts the offset value to and from the sensor value according to an open/closed state of thermostat 21. This reduces the influence of thermostat 21 on the sensor value. Here, an offset value may be corrected according to at least one of a voltage value of power supply 13 and the temperature of heater 23.

The above-described configuration and operation allow detecting an open/closed state of thermostat 21 from output of current detecting circuit 33 or voltage detecting circuit 31. This provides steering wheel grip detection device 11 that reduces the influence of thermostat 21 on detecting contact with hand 41.

In FIG. 10, a value as a basis of electrostatic sensor output fluctuates in a short cycle due to the influence of noise, and thus its average value is used as electrostatic sensor output, but not limited. For example, a maximum or minimum value during a given time period (e.g., 0.01 second) may be used as electrostatic sensor output.

Second Exemplary Embodiment

Figure 14:
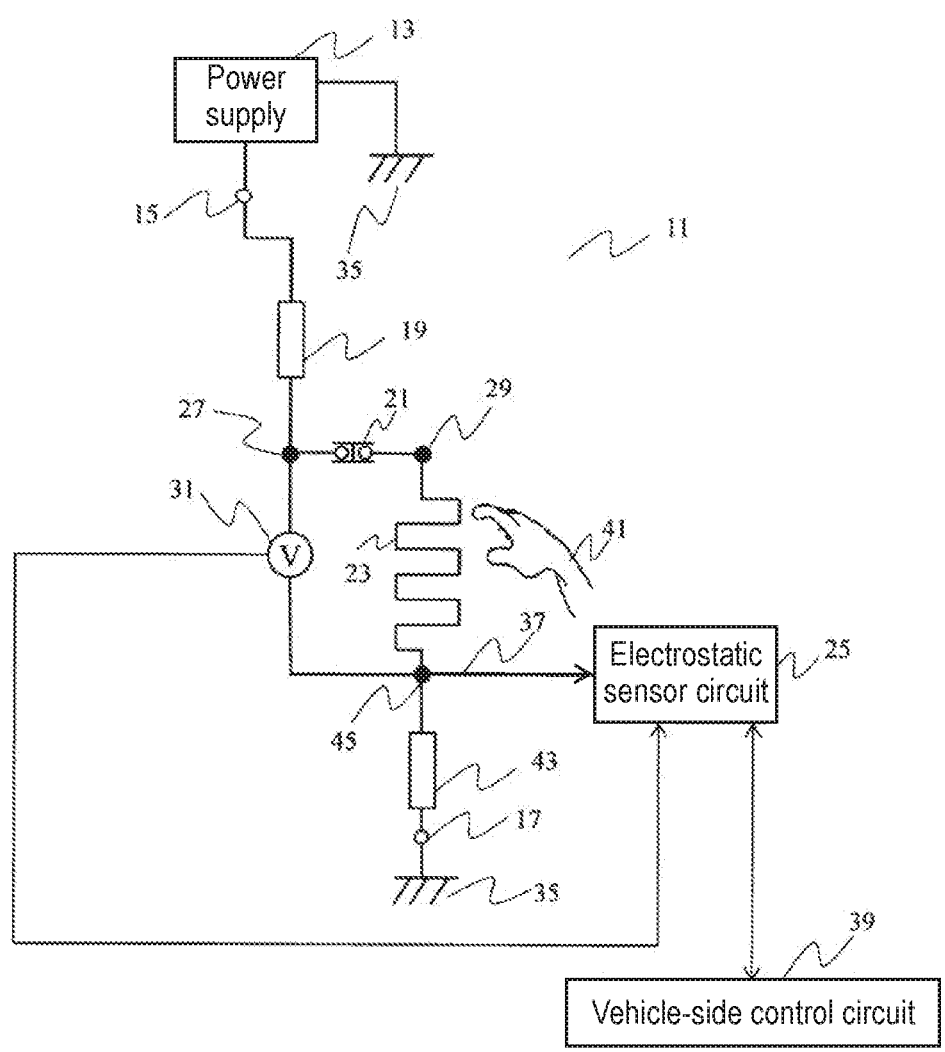
FIG. 14 A block circuit diagram of a steering wheel grip detection device according to the second exemplary embodiment.

FIG. 14 is a block circuit diagram of a steering wheel grip detection device according to the second exemplary embodiment of the present disclosure. In the second embodiment, a component same as that of the first embodiment is given the same reference mark and its detailed description is omitted.

The second embodiment features second inductance element 43 electrically connected to between heater 23 and negative electrode terminal 17 in FIG. 14.

Resultingly, even if sensor wire 37 is connected to the end of second inductance element 43 close to heater 23, an AC signal for detecting a grip of hand 41 ceases to flow to ground 35 due to the presence of second inductance element 43. Accordingly, sensor wire 37 can be connected to the wiring path from the end of heater 23 close to ground 35 to second inductance element 43, increasing flexibility of wiring sensor wire 37.

Hereinafter, a description is made of further details about the second exemplary embodiment.

In FIG. 14, second inductance element 43 is electrically connected to between connecting point 45 at the end of heater 23 opposite to the end to which inductance element 19 is connected; and negative electrode terminal 17. Here, second inductance element 43 is assumed to have electrical characteristics equivalent to those of inductance element 19, but not limited. What has different electrical characteristics may be used.

Next, sensor wire 37 of electrostatic sensor circuit 25 is electrically connected to the wiring path (connecting point 45 here) between heater 23 and second inductance element 43. Here, sensor wire 37 may be connected either to connecting point 29 as shown in FIG. 8 or to the middle of the wiring path of heater 23 as shown in FIG. 11.

Output of voltage detecting circuit 31 based on an open/closed state of thermostat 21 is as follows. First, when thermostat 21 is closed, voltage detecting circuit 31 is to detect the two-end voltage of heater 23. This voltage represents the difference between a voltage at connecting point 27 and a voltage at connecting point 45. A voltage at connecting points 27 and 45 is a partial voltage obtained from the resistance values of inductance element 19, heater 23, and second inductance element 43; and a voltage of power supply 13. Accordingly, the two-end voltage of heater 23 based on the partial voltage is output from voltage detecting circuit 31. Meanwhile, when thermostat 21 is open, voltage of connecting point 27 represents a voltage of power supply 13; a voltage at connecting point 45 represents the potential at ground 35, and thus the voltage value output from voltage detecting circuit 31 represents a voltage of power supply 13 with reference to the potential at ground 35.

Accordingly, the voltage value varies depending on whether thermostat 21 is open or closed, and thus an open/closed state of thermostat 21 can be detected even if second inductance element 43 is provided. Here, voltage detecting circuit 31 is connected based on the configurations described in FIGS. 2 through 7. It is appropriate that voltage detecting circuit 31 is connected to the two ends of each circuit component (inductance element 19, thermostat 21, heater 23, and second inductance element 43), to the two ends of any two circuit components directly series-connected, or to the two ends of any three circuit components directly series-connected.

In such steering wheel grip detection device 11, providing second inductance element 43 as described above increases the flexibility of wiring sensor wire 37. In the block diagram shown in FIG. 14 for example, one end of heater 23, sensor wire 37, and the wiring of voltage detecting circuit 31 are integrated to one position and are connected to the wiring substrate on which second inductance element 43 is mounted. This allows space saving and also incorporating the wiring substrate into steering wheel 3.

The above-described configuration provides steering wheel grip detection device 11 that reduces the influence of thermostat 21 on detecting contact with hand 41 and increases the flexibility of wiring sensor wire 37.

Third Exemplary Embodiment

Figure 15:
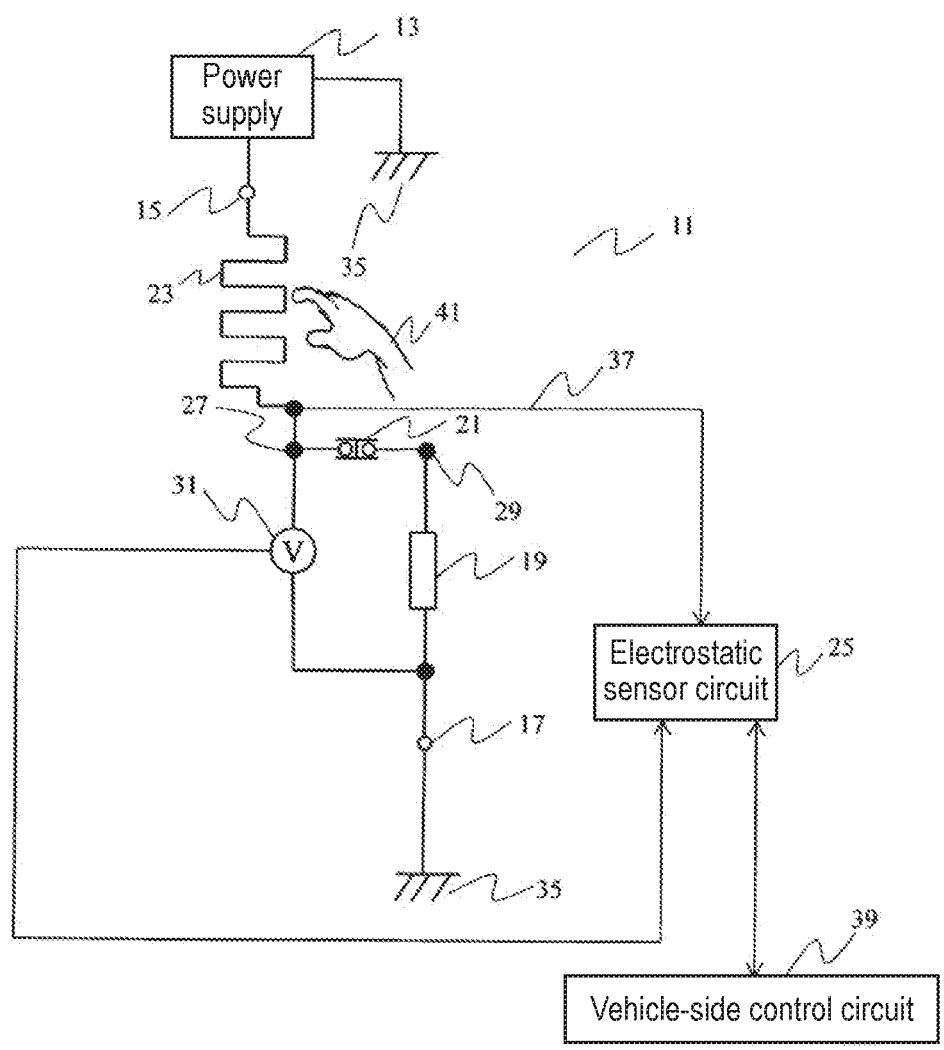
FIG. 15 A block circuit diagram of a steering wheel grip detection device according to the third exemplary embodiment.
Figure 16:
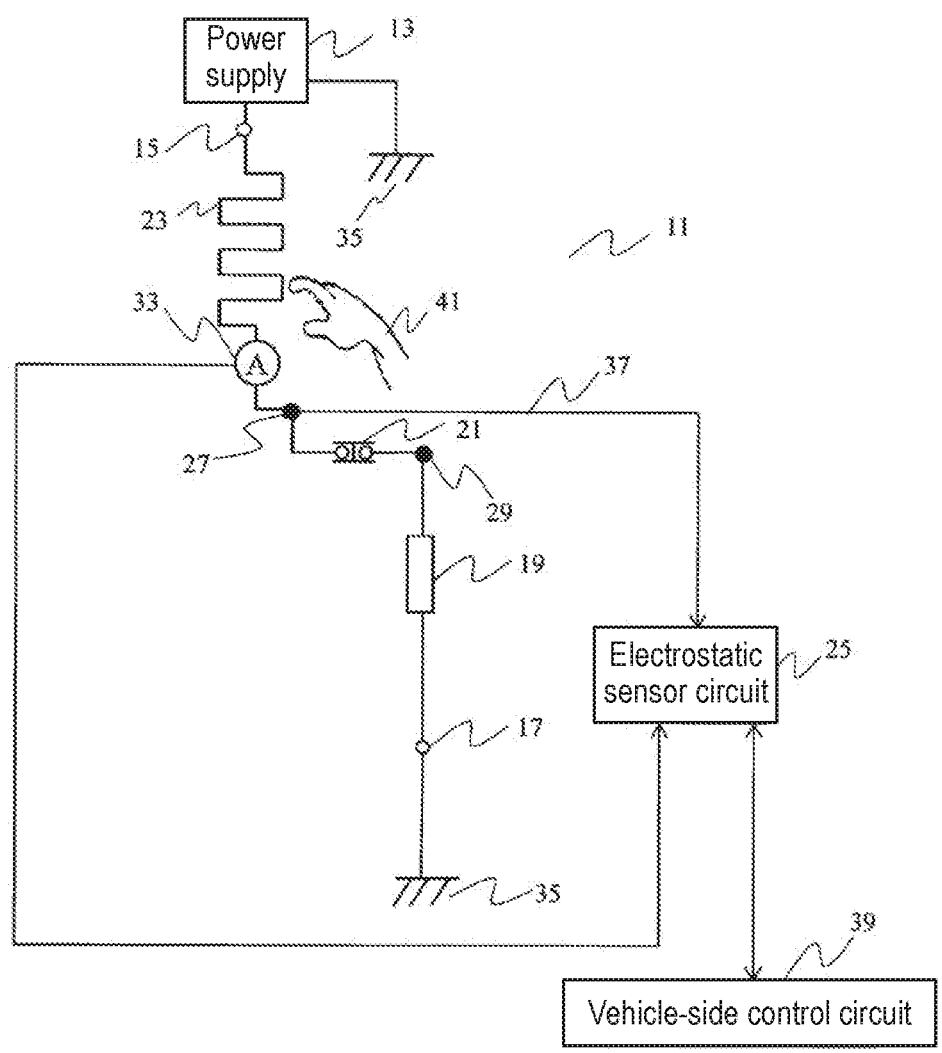
FIG. 16 Another block circuit diagram of the steering wheel grip detection device according to the third embodiment.

FIG. 15 is a block circuit diagram of a steering wheel grip detection device according to the third exemplary embodiment of the present disclosure. FIG. 16 is another block circuit diagram of the steering wheel grip detection device according to the third embodiment. In the third embodiment, a component same as that of the first embodiment is given the same reference mark and its detailed description is omitted.

The third embodiment features that, although FIG. 15 is equivalent to FIG. 6 from a viewpoint of a circuit, sensor wire 37 is not connected to connecting point 27, but to a point closest possible to heater 23. Otherwise, FIG. 15 has the same configuration as that of FIG. 8. Such a configuration allows electrostatic sensor circuit 25 to detect capacitance change of heater 23 with higher accuracy. The configuration of FIG. 15 is equivalent to that of FIG. 6, and thus electrostatic sensor circuit 25 learns an open/closed state of thermostat 21 in the same way as the configuration of FIG. 6.

The third embodiment may be as well configured similarly to the second embodiment, which means second inductance element 43 is provided that is electrically connected to between heater 23 and positive electrode terminal 15.

Concretely, second inductance element 43 is electrically connected to between the end of heater 23 close to the power supply 13 and positive electrode terminal 15. The reason for connecting this way is heater 23 of the third embodiment is structured to be connected to the positive electrode of power supply 13. Then, sensor wire 37 may be connected to the wiring path between heater 23 and second inductance element 43.

Such a configuration increases the flexibility of wiring as described in the second embodiment, as well as allows space saving by connecting the end of heater 23 and sensor wire 37 to the circuit substrate on which second inductance element 43 is mounted.

The third embodiment may be as well configured to use current detecting circuit 33 instead of voltage detecting circuit 31, similarly to the first embodiment. A concrete example is shown in FIG. 16. FIG. 16 shows an example where voltage detecting circuit 31 in FIG. 15 is removed, and current detecting circuit 33 is serially inserted in the wiring path between heater 23 and thermostat 21. Such a configuration causes a current flowing through heater 23 to change in response to an open/closed state of thermostat 21. Current detecting circuit 33 detects the change, allowing electrostatic sensor circuit 25 to detect an open/closed state of thermostat 21.

As described in the first embodiment, current detecting circuit 33 may be provided wherever in the series circuit, and thus has greater flexibility in the position in the circuit than voltage detecting circuit 31.

The above-described configuration and operation allow detecting an open/closed state of thermostat 21, which provides steering wheel grip detection device 11 that reduces the influence of thermostat 21 on detecting contact with hand 41.

Fourth Exemplary Embodiment

Figure 17:
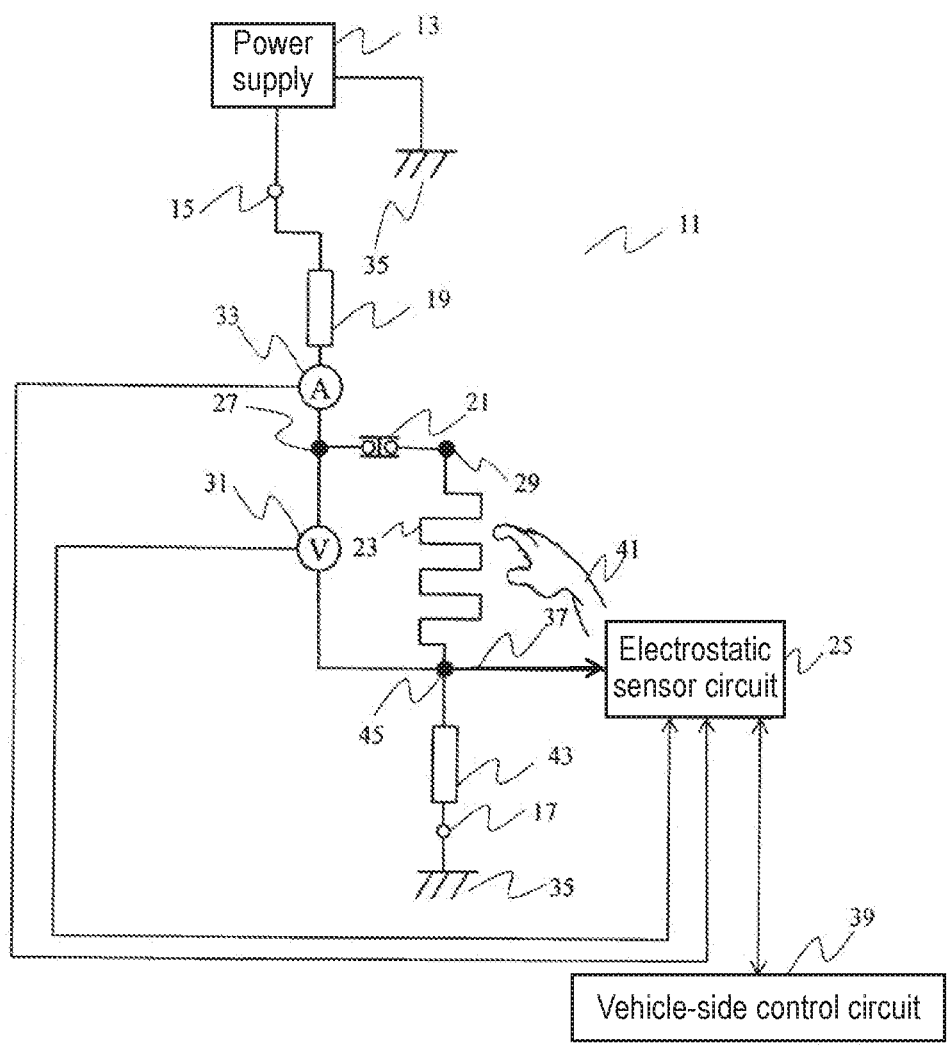
FIG. 17 A block circuit diagram of a steering wheel grip detection device according to the fourth exemplary embodiment.

FIG. 17 is a block circuit diagram of a steering wheel grip detection device according to the fourth exemplary embodiment of the present disclosure. In the fourth embodiment, a component same as that of the first embodiment is given the same reference mark and its detailed description is omitted.

The fourth embodiment features having voltage detecting circuit 31 and current detecting circuit 33 simultaneously, as shown in FIG. 17, which increases the accuracy of detecting an open/closed state of thermostat 21.

Hereinafter, a description is made of further details about the fourth embodiment.

The fourth embodiment is configured to connect current detecting circuit 33 serially to the wiring path between thermostat 21 and inductance element 19 additionally to the configuration of FIG. 14. Accordingly, as shown in FIG. 17, voltage detecting circuit 31 and current detecting circuit 33 are simultaneously provided. Both output of the circuits is input to electrostatic sensor circuit 25, and thus electrostatic sensor circuit 25 obtains both voltage values and current values.

Connecting positions of voltage detecting circuit 31 and current detecting circuit 33 are as described in the first embodiment. Concretely, as described in the second exemplary embodiment, voltage detecting circuit 31 can be connected to the two ends of each circuit component, to the two ends of any two circuit components directly series-connected, or to the two ends of any three circuit components directly series-connected, in the configuration of FIG. 17.

Current detecting circuit 33 may be connected to anywhere in the series circuit including inductance element 19, thermostat 21, and heater 23, from positive electrode terminal 15 to negative electrode terminal 17, as described in the first embodiment. In the case of FIG. 17, second inductance element 43 is further provided. Hence, current detecting circuit 33 may be connected to anywhere in the series circuit including inductance element 19, thermostat 21, heater 23, and second inductance element 43, from positive electrode terminal 15 to negative electrode terminal 17.

The above-described configuration and operation allow electrostatic sensor circuit 25 to obtain both voltage values and current values changing due to opening and closing of thermostat 21, which provides steering wheel grip detection device 11 that accurately reduces the influence of thermostat 21 on detecting contact with hand 41.

In the fourth embodiment, second inductance element 43 is connected. However, instead of second inductance element 43, current detecting circuit 33 may be provided additionally to the configuration of FIGS. 2 to 7 for example, which also provides advantages equivalent to the fourth embodiment.

Fifth Exemplary Embodiment

Figure 18:
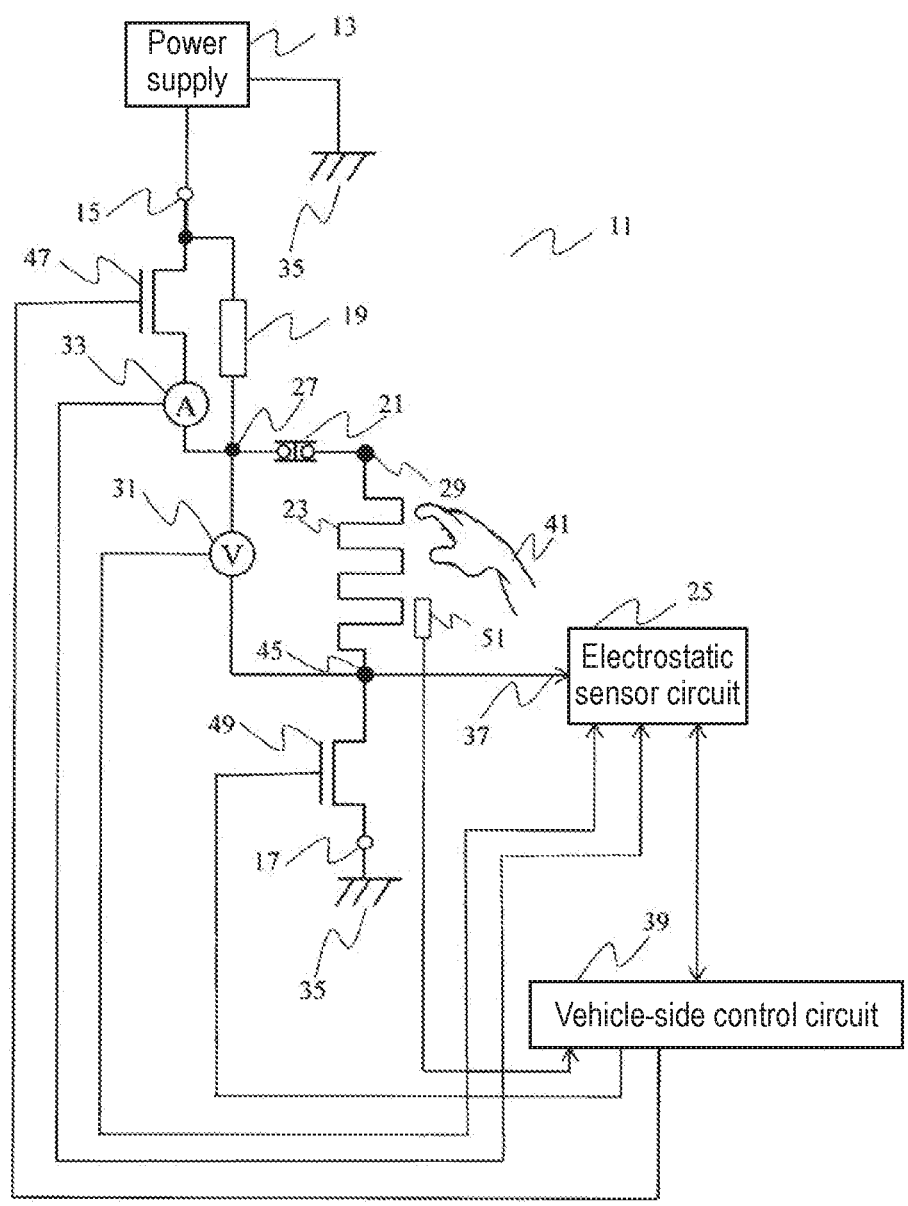
FIG. 18 A block circuit diagram of a steering wheel grip detection device according to the fifth exemplary embodiment.
Figure 19:
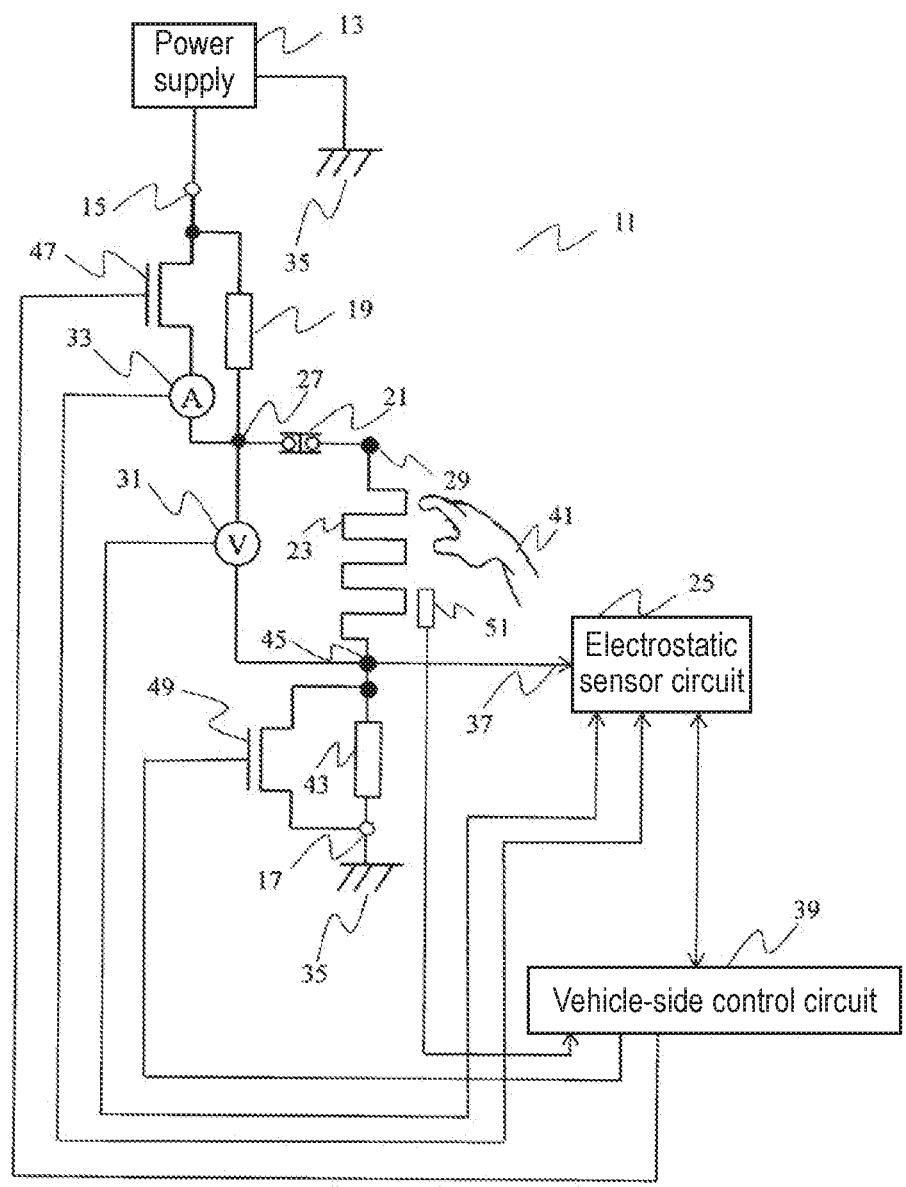
FIG. 19 Another block circuit diagram of the steering wheel grip detection device according to the fifth embodiment.
Figure 20:
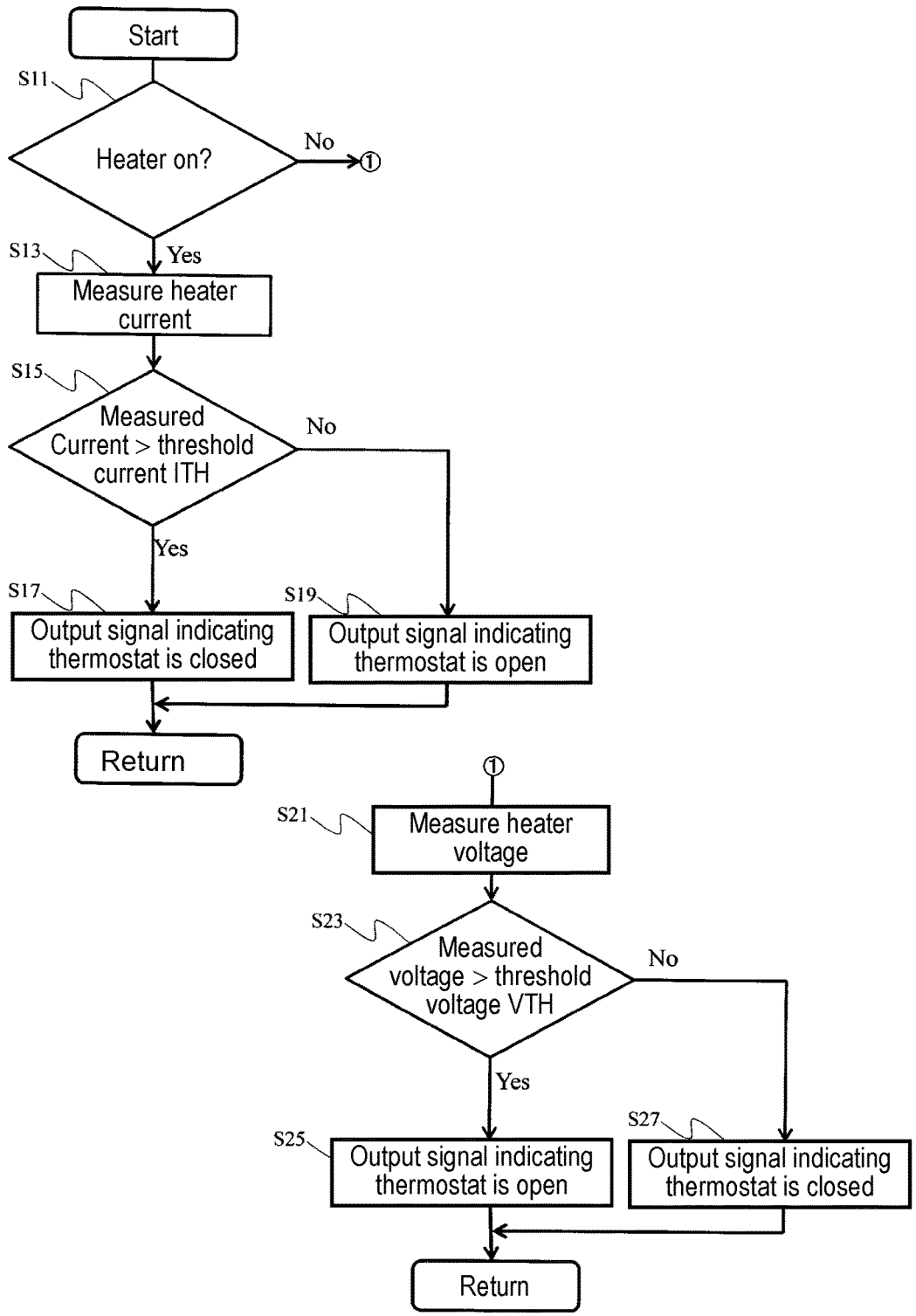
FIG. 20 A flowchart of determining an open/closed state of a thermostat of the steering wheel grip detection device according to the fifth embodiment.

FIG. 18 is a block circuit diagram of a steering wheel grip detection device according to the fifth exemplary embodiment of the present disclosure. FIG. 19 is another block circuit diagram of the steering wheel grip detection device according to the fifth embodiment of the present disclosure. FIG. 20 is a flowchart for determining an open/closed state of the thermostat of the steering wheel grip detection device according to the fifth embodiment. In the fifth embodiment, a component same as that of the first embodiment is given the same reference mark and its detailed description is omitted.

The fifth embodiment features that switch 47 is electrically connected in parallel with inductance element 19 and at the same time second switch 49 instead of second inductance element 43 is electrically connected. Further, thermistor 51 is disposed as a sensor of temperature near heater 23. In the fifth embodiment, temperature output of thermistor 51 is input to vehicle-side control circuit 39; it may be input to electrostatic sensor circuit 25. In the fifth embodiment, thermistor 51 is used as a temperature sensor, but not limited to it. Any sensor may be used as long as it can detect temperature, such as a thermocouple. Such a configuration allows switch 47 and second switch 49 to turn on and off at high speed in response to temperature output of thermistor 51, which provides accuracy higher than temperature control by thermostat 21.

Hereinafter, a description is made of further details about the fifth embodiment using FIG. 18.

First, the configuration of FIG. 18 is different from that of FIG. 17 in the following. That is, the series circuit inducing current detecting circuit 33 and switch 47 is connected to the two ends of inductance element 19, and at the same time second switch 49 instead of second inductance element 43 is connected. An on-off control signal for switch 47 and second switch 49 is configured to be output from vehicle-side control circuit 39. Further, thermistor 51 electrically connected to vehicle-side control circuit 39 is disposed near heater 23. Accordingly, vehicle-side control circuit 39 learns temperature near heater 23. The other configurations are the same as those of FIG. 17. Here, as switch 47 and second switch 49, what is externally on-off controlled can be used such as a relay and a semiconductor switch. Here, a semiconductor switch (a field-effect transistor) is used. Herewith, vehicle-side control circuit 39 on-off controls at least one of switch 47 and second switch 49 so that heater 23 keeps a given temperature based on temperature output of thermistor 51. Consequently, a current flowing through heater 23 is on-off controlled.

Switch 47 and second switch 49 operate as described above to control temperature of heater 23, and is not different from a switch for a driver to manually turn on and off heater 23.

Next, a description is made of the operation. In the fifth embodiment, switch 47 and second switch 49 are connected. At least one of these switches repeats turning on and off in response to temperature output of thermistor 51 to control temperature of heater 23, which provides accuracy higher than temperature control by thermostat 21. This temperature control is executed by vehicle-side control circuit 39.

In the configuration of the fifth embodiment, sensor wire 37 is connected to the wiring paths of heater 23 and second switch 49. Accordingly, a grip of hand 41 can be detected while second switch 49 is off. While second switch 49 is on, an AC signal for detecting a grip from electrostatic sensor circuit 25 results in flowing to ground 35, and a grip of hand 41 cannot be detected. Accordingly, it is appropriate that electrostatic sensor circuit 25 detects a grip of hand 41 while second switch 49 is off.

If second switch 49 is removed, and connecting point 45 and negative electrode terminal 17 are directly connected to each other, AC signals from electrostatic sensor circuit 25 always result in flowing to ground 35. Hence, it is appropriate that second inductance element 43 is connected to between connecting point 45 and negative electrode terminal 17, or it is appropriate that sensor wire 37 is connected to connecting point 29 and to the middle of the wiring path of heater 23.

In FIG. 18, configuration may be made in which switch 47 is removed and only second switch 49 is provided. More specifically, second switch 49 is provided that is electrically connected to the end of heater 23 opposite to the end to which inductance element 19 is connected. In this case as well, AC signals from electrostatic sensor circuit 25 result in flowing to ground 35 while second switch 49 is on, and thus it is appropriate that electrostatic sensor circuit 25 detects a grip of hand 41 while second switch 49 is off, or it is appropriate that sensor wire 37 is connected to connecting point 29 or to the middle of the wiring path of heater 23.

In the fifth embodiment, switch 47 is electrically connected in parallel with inductance element 19. Alternately, instead of switch 47, second switch 49 may be electrically connected in parallel with second inductance element 43. Even such a configuration can detect a grip of hand 41. Accordingly, switch 47 may be electrically connected in parallel with inductance element 19, or second switch 49 may be electrically connected in parallel with second inductance element 43.

Further, as shown in FIG. 19, both configurations described above may be used simultaneously. In this case, a voltage at connecting point 45 is fixed even when second switch 49 is off, unlike the configuration of FIG. 18, and thus voltage detecting circuit 31 can detect a voltage between connecting points 27 and 45 regardless of a state of second switch 49, which increases the accuracy of detecting an open/closed state of thermostat 21.

Here, detecting an open/closed state of thermostat 21 in the configuration of FIG. 18 includes on-off operation of switch 47 and second switch 49, and thus the operation shown in the flowchart of FIG. 20 is performed. The flowchart of FIG. 20 shows a subroutine called from the main routine (unillustrated) executed by the microprocessor inside electrostatic sensor circuit 25, at given intervals (e.g., 0.1 second).

When the subroutine of FIG. 20 is executed, electrostatic sensor circuit 25 first determines whether or not heater 23 is on (step: S11). For this operation, whether switch 47 is on has only to be determined Here, for detecting voltage by voltage detecting circuit 31 (described later), control is performed so that second switch 49 remains on before the subroutine of FIG. 20 is executed. Further, both switch 47 and second switch 49 are on-off controlled by vehicle-side control circuit 39, and furthermore data are exchanged between vehicle-side control circuit 39 and electrostatic sensor circuit 25. Hence, electrostatic sensor circuit 25 easily learns states of switch 47 and second switch 49 from vehicle-side control circuit 39, and easily instructs vehicle-side control circuit 39 to turn on second switch 49 for example.

If heater 23 is not on ("No" in S11), the process jumps to S21 (described later).

Meanwhile, if heater 23 is on ("Yes" in S11), electrostatic sensor circuit 25 measures a current flowing through heater 23 from output of current detecting circuit 33 (S13). Then, electrostatic sensor circuit 25 compares the current (measured current) measured in S13 with threshold current ITH. Threshold current ITH, referring to a minimum value of a current flowing through heater 23 when thermostat 21 is closed, is calculated beforehand and is stored in memory included in a peripheral circuit of electrostatic sensor circuit 25. Accordingly, a measured current smaller than threshold current ITH indicates that thermostat 21 is open.

In S15, a measured current larger than threshold current ITH ("Yes" in S15) indicates that thermostat 21 is closed. Accordingly, electrostatic sensor circuit 25 outputs a signal indicating that the thermostat is closed to vehicle-side control circuit 39 (S17).

Meanwhile, a measured current smaller than threshold current ITH ("No" in S15) indicates that thermostat 21 is open. Accordingly, electrostatic sensor circuit 25 outputs a signal indicating that the thermostat is open to vehicle-side control circuit 39 (S19).

Subsequently, both S17 and S19 end the subroutine of FIG. 20, and the process returns to the main routine.

If "Yes" in S11, heater 23 is on, and thus switch 47 is on. Further, as described above, second switch 49 is kept on so that voltage detecting circuit 31 can measure a voltage. In such a state, a voltage at connecting point 27 is fixed to a voltage of power supply 13, and a voltage at connecting point 45 is fixed to the potential at ground 35, regardless of an open/closed state of thermostat 21. Accordingly, in the configuration of FIG. 18, voltage detecting circuit 31 cannot determine an open/closed state of thermostat 21 when heater 23 is on. Hence, if "Yes" in S11 of FIG. 20, an open/closed state of thermostat 21 is detected from output of current detecting circuit 33. Here, if "No" in S11, electrostatic sensor circuit 25 measures voltage of heater 23 using voltage detecting circuit 31 (S21). Next, electrostatic sensor circuit 25 compares a voltage (a measured voltage) measured in S21 with threshold voltage VTH (S23). Here, threshold voltage VTH is described. At the stage of S21, heater 23 is off. Accordingly, the measured voltage changes as follows in response to an open/closed state of thermostat 21. First, if thermostat 21 is closed, second switch 49 is also on as described above, and thus voltage detecting circuit 31 outputs a value obtained by resistively dividing a voltage of power supply 13 by inductance element 19 and heater 23. As described above, electrostatic sensor circuit 25 corrects a partial voltage value based on voltage fluctuation of power supply 13, where description of the correction operation is omitted in the flowchart of FIG. 20. The correction operation is performed by electrostatic sensor circuit 25 in the same way each time output of voltage detecting circuit 31 is obtained, the description of which is omitted in the following description.

Meanwhile, if thermostat 21 is open, a voltage of power supply 13 is applied to voltage detecting circuit 31. Accordingly, threshold voltage VTH uses the average value of the voltage. Resultingly, a measured voltage higher than threshold voltage VTH indicates that thermostat 21 is open; otherwise, closed. Here, threshold voltage VTH is not limited to the average value. Threshold voltage VTH may be either a value around the resistively divided value or a value around a voltage of power supply 13.

According to the above description, if the measured voltage is higher than threshold voltage VTH ("Yes" in S23), electrostatic sensor circuit 25 outputs a signal indicating that the thermostat is open to vehicle-side control circuit 39 (S25). Meanwhile, if the measured voltage is equal to or lower than threshold voltage VTH ("No" in S23), electrostatic sensor circuit 25 outputs a signal indicating that the thermostat is closed to vehicle-side control circuit 39 (S27).

Subsequently, both S25 and S27 end the subroutine of FIG. 20, and the process returns to the main routine.

Here, if heater 23 is off ("No" in S11), a current does not flow to heater 23, and thus current detecting circuit 33 outputs approximately 0 A regardless of an open/closed state of thermostat 21. Accordingly, if "No" in S11, an open/closed state of thermostat 21 needs to be detected by output of voltage detecting circuit 31.

The above-described configuration and operation allow detecting an open/closed state of thermostat 21 from output of current detecting circuit 33 or voltage detecting circuit 31 when switch 47 is both on and off, and can reduce the influence of a state of thermostat 21.

In the fifth embodiment, the configuration is described until an open/closed state of thermostat 21 is output from electrostatic sensor circuit 25 to vehicle-side control circuit 39. However, this process may be controlled within electrostatic sensor circuit 25 in the following way for example. For a short opening and closing cycle of thermostat 21 and for small hysteresis in opening and closing thermostat 21, electrostatic sensor circuit 25 stops detecting contact with hand 41 when thermostat 21 is closed. Under such control, electrostatic sensor circuit 25 detects contact with hand 41 only while heater 23 is turned off by thermostat 21, which removes the influence of power supply 13 to increase the accuracy of sensing in electrostatic sensor circuit 25.

The fifth embodiment is configured so that current detecting circuit 33 is connected to the two ends of inductance element 19 with current detecting circuit 33 series-connected to switch 47, but not limited to this configuration. As illustrated in FIGS. 12, 13, 16, and 17, detecting circuit 33 may be series-connected to somewhere in the wiring path from positive electrode terminal 15 to negative electrode terminal 17.

In the fifth embodiment, switch 47 and current detecting circuit 33 are configured separately from each other, but they may be configured integrally, which can be achieved using a switching element with built-in current detecting circuit 33. That is, when the field-effect transistor used as a switching element (a semiconductor switch) in the fifth embodiment is on, a current flowing between the drain and the source can be derived from the resistance value between the drain and the source. Hence, determining voltage between the drain and the source allows measuring a current flowing through the switching element (i.e., a current flowing through heater 23). Accordingly, current detecting circuit 33 substantially results in a circuit that measures voltage between the drain and the source.

Such a configuration provides steering wheel grip detection device 11 that detects an open/closed state of thermostat 21 with a smaller size than a configuration in which current detecting circuit 33 is separately provided.

The configurations of FIGS. 18 and 19 described above include at least one of switch 47 and second switch 49. Then, heater 23 is temperature-controlled in response to temperature output of thermistor 51 by on-off control of at least one of switch 47 and second switch 49. In a configuration in which heater 23 has small errors in the temperature rising characteristic and the heat insulation characteristic, on-off control may be chronologically performed with thermistor 51 removed for example.

In the configurations of FIGS. 2 through 19, a switch (unillustrated) operated by a driver is provided for supplying power from power supply 13 to heater 23. However, as described in FIGS. 2 through 19, sensor wire 37 is connected to a position where AC signals do not flow to ground 35, which allows electrostatic sensor circuit 25 to detect a grip of hand 41 regardless of an on/off state of the switch.

In the configurations of FIGS. 2 through 8, 11, 14, and 15, which do not include switch 47, second switch 49, or current detecting circuit 33, an open/closed state of thermostat 21 is detected by only voltage detecting circuit 31. The flowchart in this case is as follows. First, the absence of switch 47 and second switch 49 causes power to be always applied to heater 23. This eliminates the need for S11 in FIG. 20, and the operation of S21 and after for measuring voltage of heater 23 is only required.

Meanwhile, in the configurations of FIGS. 12, 13, and 16, which not include switch 47, second switch 49, or voltage detecting circuit 31, an open/closed state of thermostat 21 is detected by only current detecting circuit 33. The flowchart in this case is as follows. First, the absence of switch 47 and second switch 49 causes power to be always applied to heater 23. This eliminates the need for S11 in FIG. 20, and the operation of S13 and after for measuring a current of heater 23 is only required.

In the configuration of FIG. 17, which does not include switch 47 or second switch 49, an open/closed state of thermostat 21 is detected by voltage detecting circuit 31 and current detecting circuit 33. The flowchart in this case is as follows. First, the absence of switch 47 and second switch 49 causes power to be always applied to heater 23. This eliminates the need for S11 in FIG. 20, and first operation of S13 and after is performed for measuring a current of heater 23. Then, after S17 or S19, operation of S21 and after is performed. Consequently, vehicle-side control circuit 39 obtains two types of signals of an open/closed state of thermostat 21 based on results of current measurement and voltage measurement. If both results are the same, vehicle-side control circuit 39 chooses the result. If different, vehicle-side control circuit 39 chooses the more probable one in reference to the transition of previous open/closed states for example. Here, "the more probable one" is determined as follows. The change rate of a current and a voltage due to opening and closing of thermostat 21 is far faster than the execution interval (0.1 second) of the flowchart of FIG. 20. Hence, if one outputs the change of an open/closed state while the other does not, the former result in being probable. Accordingly, vehicle-side control circuit 39 determines that the state of thermostat 21 has changed, which allows vehicle-side control circuit 39 to accurately detect an open/closed state of thermostat 21.

In the above-described three examples, electrostatic sensor circuit 25 updates the reference value when hand 41 is not in contact with steering wheel 3 in the same way, and thus further details are described later.

All of the above are summarized as follows.

First, if only voltage detecting circuit 31 is provided, output of voltage detecting circuit 31 is electrically connected to electrostatic sensor circuit 25. Electrostatic sensor circuit 25 updates the reference value when hand 41 is not in contact with steering wheel 3 based on an open/closed state of thermostat 21 obtained from output of voltage detecting circuit 31, in the following way. This reduces the influence of opening and closing of thermostat 21 on output of electrostatic sensor circuit 25.

Next, if only current detecting circuit 33 is provided, output of current detecting circuit 33 is electrically connected to electrostatic sensor circuit 25. Electrostatic sensor circuit 25 updates the reference value when hand 41 is not in contact with steering wheel 3 based on an open/closed state of thermostat 21, in the following way. This also reduces the influence of opening and closing of thermostat 21 on output of electrostatic sensor circuit 25.

Next, if both voltage detecting circuit 31 and current detecting circuit 33 are provided, output of voltage detecting circuit 31 and output of current detecting circuit 33 is electrically connected to electrostatic sensor circuit 25. Electrostatic sensor circuit 25 updates the reference value when hand 41 is not in contact with steering wheel 3 based on an open/closed state of thermostat 21 obtained from output of voltage detecting circuit 31 and output of current detecting circuit 33. Resultingly, an open/closed state of thermostat 21 based on a voltage value and a current value can be obtained, which accurately reduces the influence of opening and closing of thermostat 21 on output of electrostatic sensor circuit 25.

Here, a description is made of correction of a sensor value from electrostatic sensor circuit 25 based on an open/closed state of thermostat 21. In any configuration described in the fifth embodiment, correction is made, for example, by addition and subtraction of an offset value preliminarily saved in electrostatic sensor circuit 25 to and from a sensor value, based on an open/closed state of thermostat 21 as described in the first embodiment.

Next, a description is made in the sixth embodiment, of details about correction in which electrostatic sensor circuit 25 updates the reference value when hand 41 is not in contact with steering wheel 3.

In the fifth embodiment, the flowchart of FIG. 20 is executed by electrostatic sensor circuit 25, which is electrically connected to vehicle-side control circuit 39 to be able to exchange various types of signals. For this reason, the flowchart of FIG. 20 may be executed by vehicle-side control circuit 39. Furthermore, electrostatic sensor circuit 25 may be incorporated into vehicle-side control circuit 39, which can save space.

Sixth Exemplary Embodiment

Figure 21:
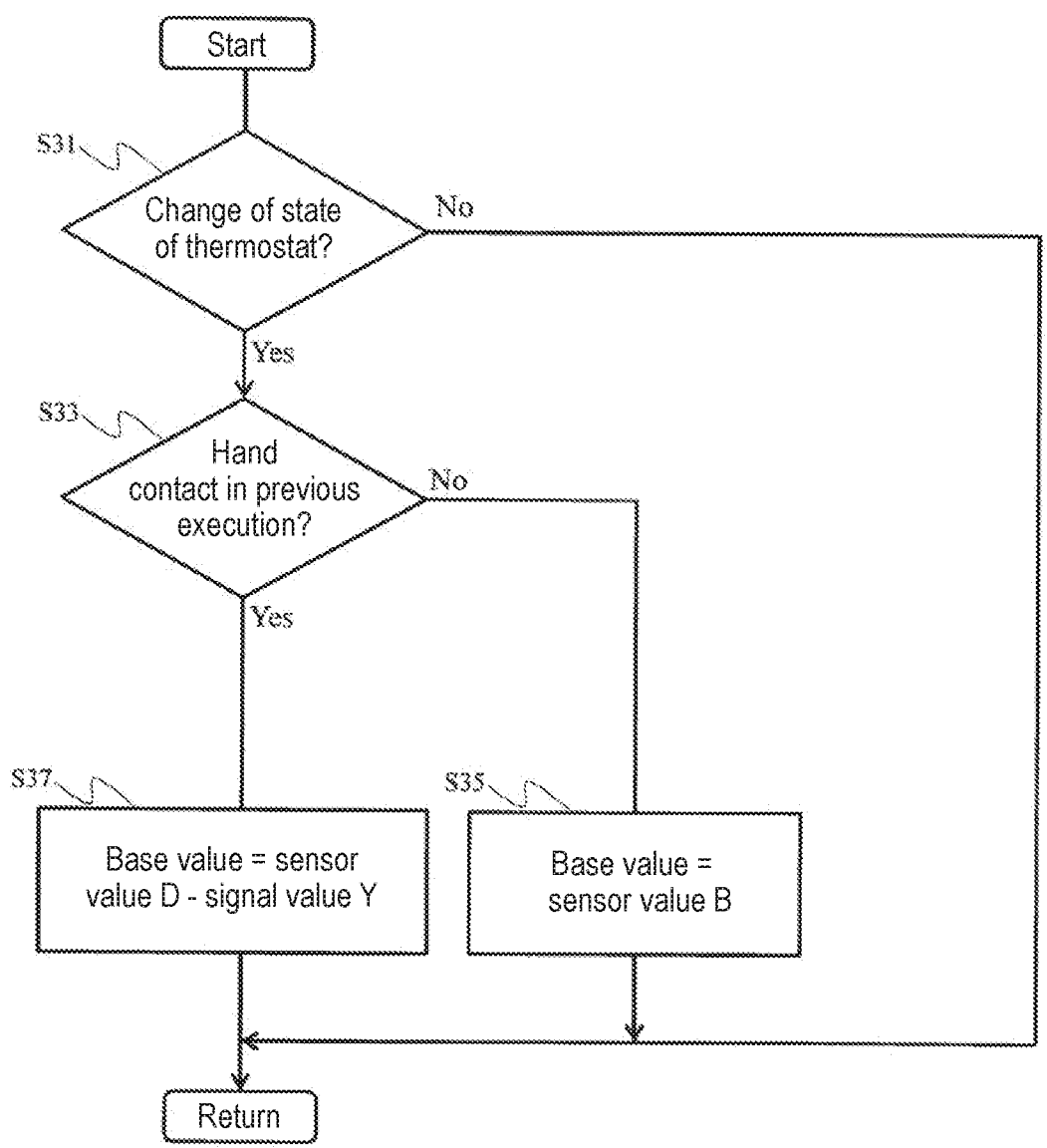
FIG. 21 A flowchart illustrating operation of a steering wheel grip detection device according to the sixth exemplary embodiment.
Figure 22A:
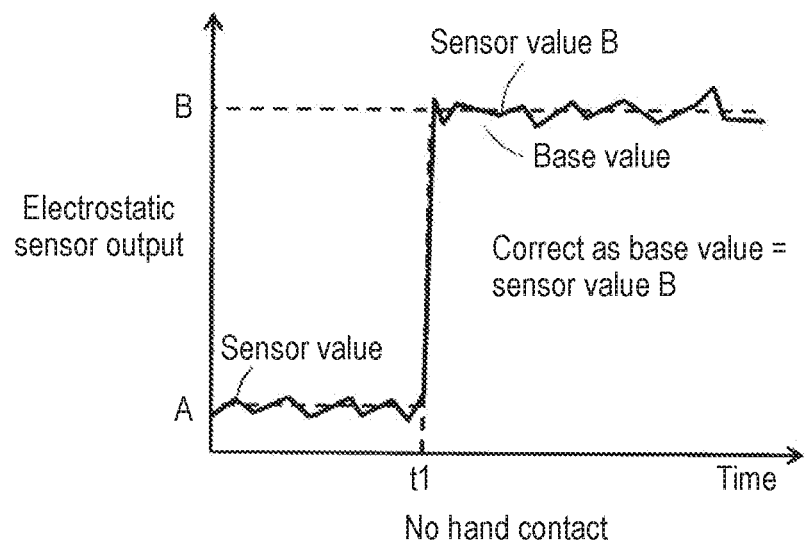
FIG. 22A A temporal characteristic diagram of electrostatic sensor output of the steering wheel grip detection device according to the sixth embodiment, without hand contact.
Figure 22B:
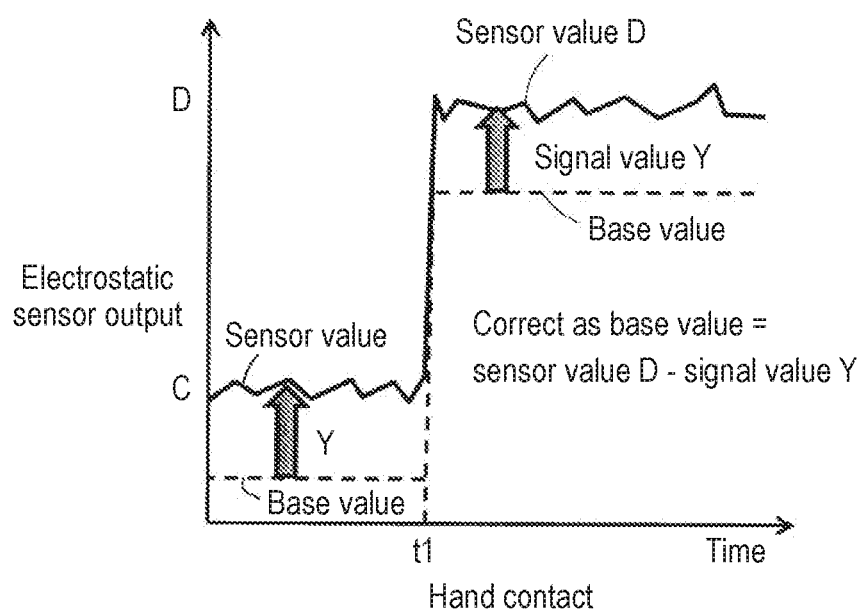
FIG. 22B A temporal characteristic diagram of electrostatic sensor output of the steering wheel grip detection device according to the sixth embodiment, with hand contact.

FIG. 21 is a flowchart illustrating operation of a steering wheel grip detection device according to the sixth exemplary embodiment of the disclosure. FIGS. 22A and 22B are temporal characteristic diagrams of electrostatic sensor output of the steering wheel grip detection device according to the sixth embodiment, where FIG. 22A is that without hand contact, and FIG. 22B is that with hand contact. The configuration of the sixth embodiment is the same as those of FIGS. 18 and 19 described in the fifth embodiment and their deformed configurations, and thus its description is omitted. The sixth embodiment features as follows.

(1) Output of voltage detecting circuit 31 is electrically connected to electrostatic sensor circuit 25. Electrostatic sensor circuit 25 updates the reference value when hand 41 is not in contact with steering wheel 3, based on an open/closed state of thermostat 21 obtained from output of voltage detecting circuit 31 and on the presence or absence of a grip of steering wheel 3.

(2) Output of current detecting circuit 33 is electrically connected to electrostatic sensor circuit 25. Electrostatic sensor circuit 25 updates the reference value when hand 41 is not in contact with steering wheel 3, based on an open/closed state of thermostat 21 obtained from output of current detecting circuit 33 and on the presence or absence of a grip of steering wheel 3.

(3) Output of voltage detecting circuit 31 and output of current detecting circuit 33 are electrically connected to electrostatic sensor circuit 25. Electrostatic sensor circuit 25 updates the reference value when hand 41 is not in contact with steering wheel 3, based on an open/closed state of thermostat 21 obtained from output of voltage detecting circuit 31 and output of current detecting circuit 33 and on the presence or absence of a grip of steering wheel 3.

One of the above is performed. This feature reduces the influence of thermostat 21 on the reference value changing particularly largely, in addition to detecting an open/closed state of thermostat 21, to detect contact with hand 41 with higher accuracy.

Hereinafter, a description is made of further details about the sixth embodiment.

FIG. 21 is a flowchart illustrating operation characteristic of the sixth embodiment. This flowchart shows a subroutine executed by the main routine by means of a microprocessor at given intervals (e.g., 0.1 second).

When the subroutine of FIG. 21 is executed, electrostatic sensor circuit 25 determines whether or not the open/closed state of thermostat 21 has changed (S31). To determine the change, electrostatic sensor circuit 25 is configured to store the previous execution result of the subroutine in memory. Accordingly, at the stage of S31, electrostatic sensor circuit 25 learns the open/closed state of thermostat 21 when the subroutine was previously executed. If there is no change in the open/closed state here ("No" in S31), thermostat 21 does not influence electrostatic sensor circuit 25, and thus the subroutine is directly ended and the process returns to the main routine.

Meanwhile, if there is change in the open/closed state of thermostat 21 ("Yes" in S31), electrostatic sensor circuit 25 then determines whether or not there is contact of heater 23 (i.e., steering wheel 3) with hand 41 when the subroutine of FIG. 21 was previously executed (S33). At the stage of S33, electrostatic sensor circuit 25 is configured to fetch this-time presence or absence of contact with hand 41 from output of electrostatic sensor circuit 25 and to store the result in memory. If there is no contact with hand 41 in the previous execution ("No" in S33), the state of thermostat 21 has changed, but there is no electrostatic sensor output caused by hand 41. Such a state is shown in FIG. 22A. In FIG. 22A, the horizontal axis represents time; the vertical axis represents electrostatic sensor output (output of electrostatic sensor circuit 25, i.e., a sensor value). Now, the state of thermostat 21 is changing, and thus "No" in S33 corresponds to time t1 in FIG. 22A. That is, the open/closed state of thermostat 21 has changed, which causes electrostatic sensor output (the sensor value) to increase sharply from value A to value B at time t1. This value after having changed is referred to sensor value B. However, the sensor value (an output value of electrostatic sensor circuit 25) represents temporal characteristics substantially the same as the base value (a sensor value when there is no contact with hand 41, i.e., a reference value). Accordingly, to correct the base value, sensor value B greatly changed due to thermostat 21 has only to be directly used as the base value (S35). As a result of determining the presence or absence of contact with hand 41 with respect to the base value updated in this way, fluctuation of the base value due to thermostat 21 can be reduced. Subsequently, electrostatic sensor circuit 25 ends the subroutine of FIG. 21 and returns to the main routine.

Meanwhile, if there is contact with hand 41 in the previous execution ("Yes" in S33), the state of thermostat 21 changes and at the same time sensor output caused by hand 41 is present. For this reason, the base value needs to be corrected by the sensor value and the signal value (the sensitivity due to contact with hand 41). The state of this correction is shown in FIG. 22B. In FIG. 22B, the horizontal axis represents time; the vertical axis, electrostatic sensor output. Now, the state of thermostat 21 is changing, and thus "Yes" in S33 corresponds to time t1 in FIG. 22B. That is, the open/closed state of thermostat 21 has changed, which causes electrostatic sensor output (sensor value) to increase sharply from value C to value D at time t1. Further, signal value Y due to contact with hand 41 with respect to the base value is added to the sensor value. The sensor value changed by these actions is referred to sensor value D. Here, sensor value D (an output value of electrostatic sensor circuit 25) represents temporal characteristics substantially the same as the value calculated by adding signal value Y to the base value (reference value). Accordingly, to correct the base value, signal value Y has only to be subtracted from sensor value D greatly changed due to thermostat 21 (S37). As a result of determining the presence or absence of contact with hand 41 with respect to the base value updated in this way, fluctuation of the base value due to thermostat 21 can be reduced. Subsequently, electrostatic sensor circuit 25 ends the subroutine of FIG. 21 and returns to the main routine.

The above-described configuration and operation provide steering wheel grip detection device 11 that reduces the influence of thermostat 21 on the reference value changing particularly largely, in addition to detecting an open/closed state of thermostat 21, to detect contact with hand 41 with higher accuracy.

Seventh Exemplary Embodiment

Figure 23:
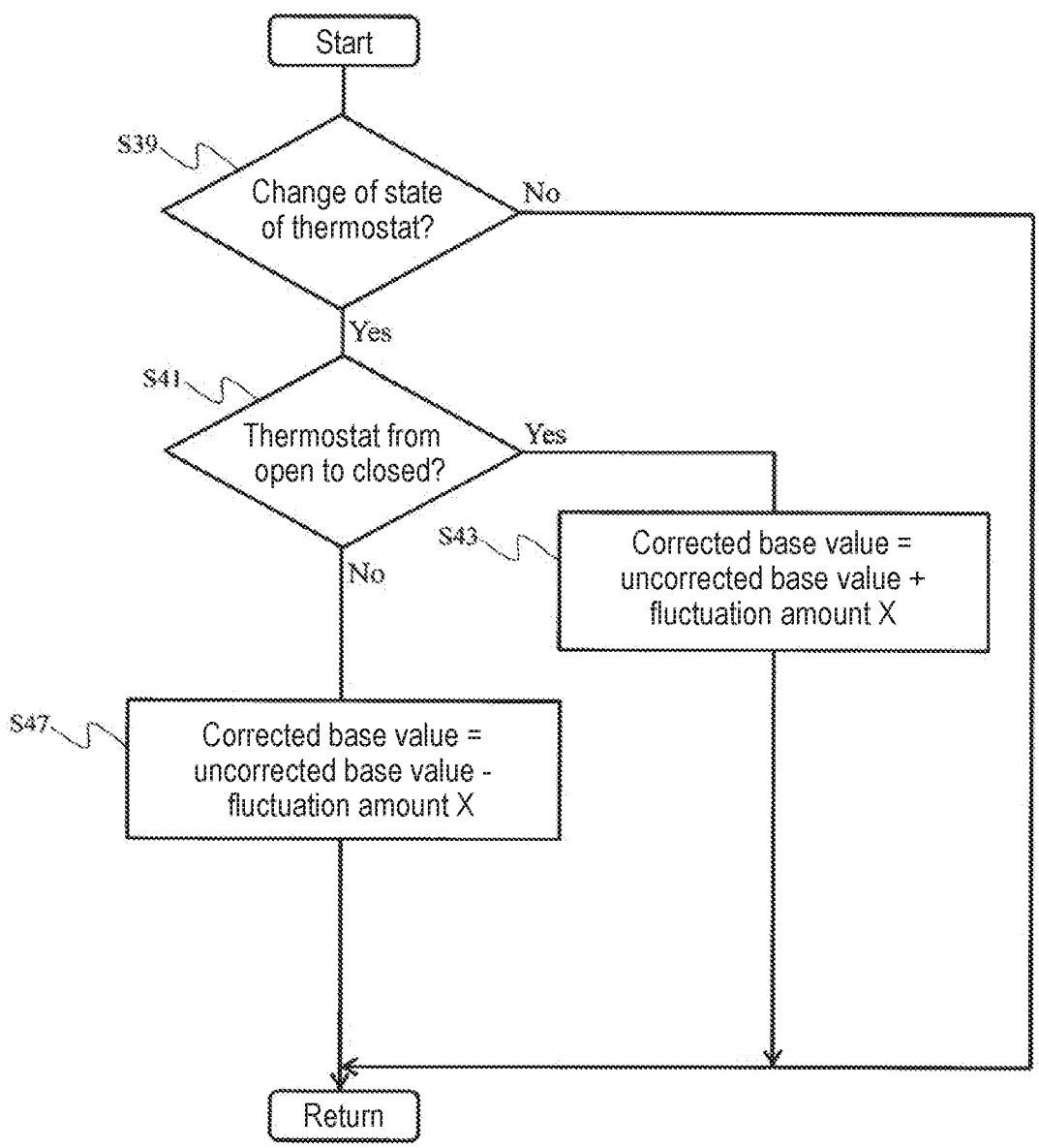
FIG. 23 A flowchart illustrating operation of a steering wheel grip detection device according to the seventh exemplary embodiment.
Figure 24A:
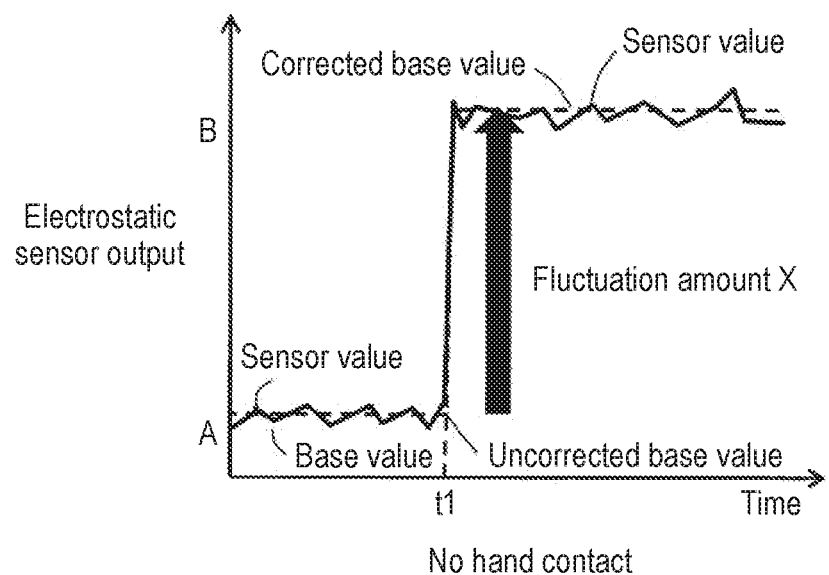
FIG. 24A A temporal characteristic diagram of electrostatic sensor output of the steering wheel grip detection device according to the seventh embodiment, without hand contact.
Figure 24B:
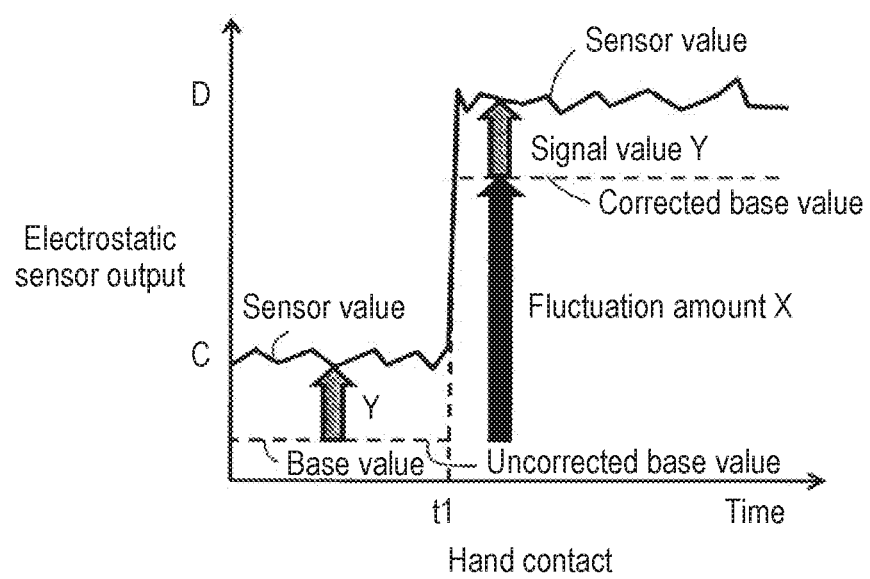
FIG. 24B A temporal characteristic diagram of electrostatic sensor output of the steering wheel grip detection device according to the seventh embodiment, with hand contact.
Figure 25:
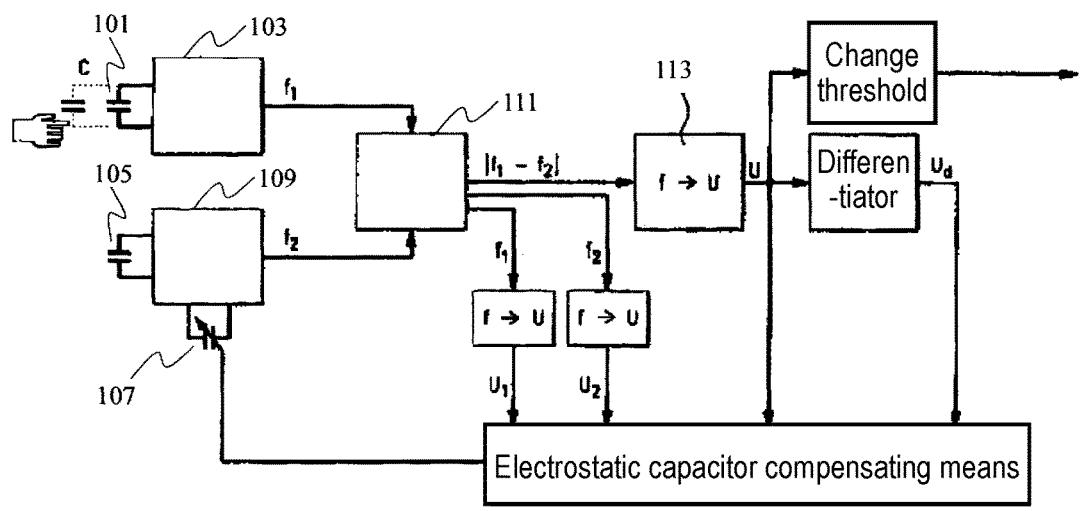
FIG. 25 A block circuit diagram of an existing device for detecting contact between hands and a steering wheel.

FIG. 23 is a flowchart illustrating operation of a steering wheel grip detection device according to the seventh embodiment of the present disclosure. FIGS. 24A and 24B are temporal characteristic diagrams of electrostatic sensor output of the steering wheel grip detection device according to the seventh embodiment, where FIG. 24A is that without hand contact, and FIG. 24B is that with hand contact. The configuration of the seventh embodiment is the same as those of FIGS. 18 and 19 described in the fifth embodiment and their deformed configurations, and thus its description is omitted. The seventh embodiment features as follows.

(1) Output of voltage detecting circuit 31 is electrically connected to electrostatic sensor circuit 25. Electrostatic sensor circuit 25 updates the reference value when hand 41 is not in contact with steering wheel 3, based on an open/closed state of thermostat 21 obtained from output of voltage detecting circuit 31.

(2) Output of current detecting circuit 33 is electrically connected to electrostatic sensor circuit 25. Electrostatic sensor circuit 25 updates the reference value when hand 41 is not in contact with steering wheel 3, based on an open/closed state of thermostat 21 obtained from output of current detecting circuit 33.

(3) Output of voltage detecting circuit 31 and output of current detecting circuit 33 are electrically connected to electrostatic sensor circuit 25. Electrostatic sensor circuit 25 updates the reference value when hand 41 is not in contact with steering wheel 3, based on an open/closed state of thermostat 21 obtained from output of voltage detecting circuit 31 and output of current detecting circuit 33.

One of the above is performed. This feature reduces the influence of thermostat 21 on the reference value changing particularly largely, in detecting an open/closed state of thermostat 21, to detect contact with hand 41 with higher accuracy.

The configuration of the seventh embodiment is different from that of the sixth embodiment in the following. To update the reference value, the sixth embodiment is based on an open/closed state of thermostat 21 and on the presence or absence of a grip of steering wheel 3. The seventh embodiment is based only on an open/closed state of thermostat 21 as described hereinafter.

Hereinafter, a description is made of further details about the seventh embodiment.

FIG. 23 is a flowchart illustrating operation characteristic of the seventh embodiment. This flowchart shows a subroutine called from the main routine at given intervals (e.g., 0.1 second).

When the subroutine of FIG. 23 is executed, electrostatic sensor circuit 25 determines whether or not the open/closed state of thermostat 21 has changed (S39). This operation is the same as that of S31 in FIG. 21. If there is no change in the open/closed state ("No" in S39), thermostat 21 does not influence electrostatic sensor circuit 25, and thus the subroutine is directly ended and the process returns to the main routine.

Meanwhile, if there is change in the open/closed state of thermostat 21 ("Yes" in S39), electrostatic sensor circuit 25 then determines whether or not the state of thermostat 21 has changed from open to closed (S41). If the state has changed from open to closed ("Yes" in S41), fluctuation amount X is added to the uncorrected base value to yield a corrected base value (S43). Further details about this operation is described using FIGS. 24A and 24B. In both FIGS. 24A and 24B, the horizontal axis represents time; the vertical axis, electrostatic sensor output. First, FIG. 24A shows a case without contact with hand 41. Here, electrostatic sensor output including that immediately before and after thermostat 21 opens and closes is regularly monitored by the main routine. Accordingly, the uncorrected base value represents value A immediately before thermostat 21 changes from an open state to closed. The uncorrected base value is the average value of fluctuation ranges in noise of electrostatic sensor output.

When thermostat 21 changes from an open state to closed at time t1, electrostatic sensor output increases by fluctuation amount X indicated by the bold arrow in FIG. 24A. Thus the corrected base value after time t1 is value B derived by adding fluctuation amount X to the uncorrected base value. Accordingly, correction is performed as described in S43. Fluctuation amount X is derived by subtracting value A from value B.

Next, a description is made of correction in a case where hand 41 has been in contact using FIG. 24B. Thermostat 21 operates during a period of as short as 0.1 second or less, and thus hand 41 is assumed to continue to be in contact before and after thermostat 21 changes from an open state to a closed. In this case, before time t1, the sensor value is value C derived by adding signal value Y to the base value. At time t1, when thermostat 21 has changed from an open state to closed, the sensor value is a value derived by adding fluctuation amount X (described in FIG. 24A) and signal value Y to the base value before changing. Here, signal value Y remains unchanged before and after thermostat 21 opens or closes, and thus the corrected base value is derived by adding fluctuation amount X to the uncorrected value in consideration of only the base value. This operation is the same as that of S43.

Accordingly, to correct the base value in the seventh embodiment, signal value Y does not need to be considered. That is, the base value can be corrected by the operation of S43 regardless of the presence or absence of contact with hand 41.

After S43, electrostatic sensor circuit 25 ends the subroutine of FIG. 23 and returns to the main routine.

Meanwhile, if thermostat 21 has not changed from an open state to a closed ("No" in S41), namely from a closed to an open, a corrected base value is derived by subtracting fluctuation amount X from the uncorrected base value (S47). This is because electrostatic sensor output rapidly decreases at time t1 when thermostat 21 changes from a closed state to an open, contrarily to FIGS. 24A and 24B. The other concepts of correction are the same as those of FIGS. 24A and 24B.

After S47, electrostatic sensor circuit 25 ends the subroutine of FIG. 23 and returns to the main routine.

In the seventh embodiment, fluctuation amount X is added to an uncorrected base value in a case where thermostat 21 has changed from an open state to a closed. However, in some configurations of steering wheel 3 and heater 23, electrostatic sensor output may fluctuate in the reverse direction in a case where thermostat 21 has changed from an open state to a closed. In such a case, it is only required that S47 is executed if "Yes" in S41; S43, if "No."

The above-described configuration provides steering wheel grip detection device 11 that reduces the influence of thermostat 21 on the reference value changing particularly largely, in detecting an open/closed state of thermostat 21, to detect contact with hand 41 with higher accuracy.

INDUSTRIAL APPLICABILITY

A steering wheel grip detection device of the present disclosure detects an open/closed state of a thermostat, and thus is useful particularly for those detecting a grip of hands with a heater.

REFERENCE MARKS IN THE DRAWINGS 2 front window
3 steering wheel
6 driver's seat
7 shift lever
8 passenger's seat
11 steering wheel grip detection device
13 power supply
15 positive electrode terminal
17 negative electrode terminal
19 inductance element
21 thermostat
23 heater
25 electrostatic sensor circuit
27, 29, 45 connecting point
31 voltage detecting circuit
33 current detecting circuit
35 ground
37 sensor wire
39 vehicle-side control circuit
41 hand
43 second inductance element
47 switch
49 second switch
51 thermistor
101 capacitor
103 oscillator
109 oscillator
111 mixer
113 voltage converter

The invention claimed is:

1. A steering wheel grip detection device, comprising:
a series circuit electrically connected between a positive electrode and a negative electrode of a power supply and including a first inductor, a thermostat incorporated into a steering wheel, and a heater incorporated into the steering wheel;
an electrostatic sensor circuit electrically connected to an end of the heater to which the first inductor is electrically connected, or to a middle of a wiring path of the heater, the electrostatic sensor circuit detecting a contact with the steering wheel by means of an electric or electromagnetic field; and
a voltage detecting circuit electrically connected:
between a wiring path of the positive electrode and any one of connecting points between the first inductor, the thermostat, and the heater;
between a wiring path of the negative electrode and any one of connecting points between the first inductor, the thermostat, and the heater;
to two ends of the first inductor;
to two ends of the heater;
or to two ends of the thermostat,
wherein an output of the voltage detecting circuit is electrically connected to the electrostatic sensor circuit,
wherein the electrostatic sensor circuit corrects an output of the electrostatic sensor circuit based on an open or closed state of the thermostat obtained from the output of the voltage detecting circuit, and
wherein the electrostatic sensor circuit updates a reference value which is the output of the electrostatic sensor circuit when a hand is not in contact with the steering wheel.

2. The steering wheel grip detection device of claim 1, further comprising:
a second inductor electrically connected to a second end of the heater opposite to the end to which the first inductor is connected,
wherein the voltage detecting circuit is connected
to two ends of one of circuit components including the first inductor, the thermostat, the heater, and the second inductor,
to two ends of any two of the circuit components directly and series-connected, or
to two ends of any three of the circuit components directly and series-connected.

3. The steering wheel grip detection device of claim 1, wherein a switch is electrically connected in parallel with the first inductor.

4. The steering wheel grip detection device of claim 2, wherein a switch is electrically connected in parallel with the second inductor.

5. The steering wheel grip detection device of claim 1, further comprising:
a switch electrically connected to a second end of the heater opposite to the end to which the first inductor is connected.

6. The steering wheel grip detection device of claim 1, wherein the electrostatic sensor circuit retains an offset value at a sensor value detected by electrostatic sensor circuit, based on the open or closed state of the thermostat obtained from the output of the voltage detecting circuit, and adds the offset value to the sensor value or subtracts the offset value from the sensor value, in response to a change of the open or closed state.

7. The steering wheel grip detection device of claim 1, further comprising:
a current detecting circuit electrically and series-connected to a wiring path of the series circuit.

8. The steering wheel grip detection device of claim 7, wherein the output of the voltage detecting circuit and an output of the current detecting circuit are electrically connected to the electrostatic sensor circuit, and
wherein the electrostatic sensor circuit updates the reference value based on the open or closed state of the thermostat obtained from the output of the voltage detecting circuit and the output of the current detecting circuit, the reference value being the output of the electrostatic sensor circuit when the hand is not in contact with the steering wheel.

9. The steering wheel grip detection device of claim 7, wherein the output of the voltage detecting circuit and an output of the current detecting circuit are electrically connected to the electrostatic sensor circuit, and
wherein the electrostatic sensor circuit retains an offset value at a sensor value detected by the electrostatic sensor circuit, based on the open or closed state of the thermostat obtained from the output of the voltage detecting circuit and the output of the current detecting circuit, and adds the offset value to the sensor value or subtracts the offset value from the sensor value, in response to a change of the open or closed state.

10. A steering wheel grip detection device comprising:
a series circuit electrically connected between a positive electrode and a negative electrode of a power supply and including a first inductor, a thermostat incorporated into a steering wheel, and a heater incorporated into the steering wheel;
an electrostatic sensor circuit electrically connected to an end of the heater to which the first inductor is electrically connected, or to a middle of a wiring path of the heater, the electrostatic sensor circuit detecting a contact with the steering wheel by means of an electric or electromagnetic field; and
a current detecting circuit electrically and series-connected to a wiring path of the series circuit,
wherein an output of the current detecting circuit is electrically connected to the electrostatic sensor circuit,
wherein the electrostatic sensor circuit corrects an output of the electrostatic sensor circuit based on an open/closed state of the thermostat obtained from the output of the current detecting circuit, and
wherein the electrostatic sensor circuit updates a reference value which is the output of the electrostatic sensor circuit when a hand is not in contact with the steering wheel.

11. The steering wheel grip detection device of claim 10, wherein the electrostatic sensor circuit corrects output of the electrostatic sensor circuit based on an open or closed state of the thermostat obtained from output of the voltage detecting circuit wherein the electrostatic sensor circuit retains an offset value at a sensor value detected by the electrostatic sensor circuit, based on the open/closed state of the thermostat obtained from the output of the current detecting circuit, and adds the offset value to the sensor value or subtracts the offset value from the sensor value, in response to a change of the open/closed state.

12. The steering wheel grip detection device of claim 6, wherein the offset value is determined based on an actual measured value of the offset value generated by a change of the sensor value due to a previous opening and closing of the thermostat.

13. The steering wheel grip detection device of claim 9, wherein the offset value is determined based on an actual measured value of the offset value generated by a change of the sensor value due to a previous opening and closing of the thermostat.

14. The steering wheel grip detection device of claim 11, wherein the offset value is determined based on an actual measured value of the offset value generated by a change of the sensor value due to a previous opening and closing of the thermostat.

15. A steering wheel grip detection device, comprising:
a series circuit electrically connected between a positive electrode and a negative electrode of a power supply and including a first inductor, a thermostat incorporated into a steering wheel, and a heater incorporated into the steering wheel;
an electrostatic sensor circuit electrically connected to an end of the heater to which the first inductor is electrically connected, or to a middle of a wiring path of the heater, the electrostatic sensor circuit detecting a contact with the steering wheel by means of an electric or electromagnetic field;
a switch electrically connected to a second end of the heater opposite to the end to which the first inductor is connected; and
a voltage detecting circuit electrically connected:
between a wiring path of the positive electrode and any one of connecting points between the first inductor, the thermostat, and the heater;
between a wiring path of the negative electrode and any one of connecting points between the first inductor, the thermostat, and the heater;
to two ends of the first inductor;
to two ends of the heater;
or to two ends of the thermostat,
wherein an output of the voltage detecting circuit is electrically connected to the electrostatic sensor circuit, and
wherein the electrostatic sensor circuit corrects an output of the electrostatic sensor circuit based on an open or closed state of the thermostat obtained from the output of the voltage detecting circuit.

* * * * *